(12) United States Patent
Birnbach et al.

(10) Patent No.: US 11,322,814 B2
(45) Date of Patent: May 3, 2022

(54) METHOD AND APPARATUS FOR PROTECTING ELECTRICAL COMPONENTS FROM A TRANSIENT ELECTROMAGNETIC DISTURBANCE TRANSMITTED ON PARALLEL POWER LINES

(71) Applicant: Advanced Fusion Systems LLC, Newtown, CT (US)

(72) Inventors: Curtis A. Birnbach, New Rochelle, NY (US); John Anthony Cappelletti, Charlotte, NC (US)

(73) Assignee: Advanced Fusion Systems LLC, New Rochelle, NY (US)

( * ) Notice: Subject to any disclaimer, the term of this patent is extended or adjusted under 35 U.S.C. 154(b) by 0 days.

(21) Appl. No.: 17/204,527

(22) Filed: Mar. 17, 2021

(65) Prior Publication Data

US 2021/0305670 A1  Sep. 30, 2021

Related U.S. Application Data

(63) Continuation-in-part of application No. 16/773,418, filed on Jan. 27, 2020.

(51) Int. Cl.
*H01P 1/22* (2006.01)
*H03K 5/1252* (2006.01)
*H01P 1/26* (2006.01)

(52) U.S. Cl.
CPC .............. *H01P 1/22* (2013.01); *H01P 1/225* (2013.01); *H01P 1/26* (2013.01); *H03K 5/1252* (2013.01)

(58) Field of Classification Search
CPC .... H01P 1/22; H01P 1/225; H01P 1/26; H01P 1/266; H03K 5/1252
See application file for complete search history.

(56) References Cited

U.S. PATENT DOCUMENTS 3,914,715 A * 10/1975 Hubing .................. H01P 1/068
                                                                333/24 R
5,323,299 A    6/1994 Weber
(Continued)

FOREIGN PATENT DOCUMENTS

| AU | 2011201033 | 5/2011 |
| CA | 2772219 | 3/2011 |
| WO | WO 2010/047890 | 4/2010 |

OTHER PUBLICATIONS

Barnes et al., "Electromagnetic Pulse Research on Electric Power Systems: Program Summary and Recommendations", Oak Ridge National Laboratory, Jan. 1993.
(Continued)

*Primary Examiner* — Jung Kim
(74) *Attorney, Agent, or Firm* — Leason Ellis LLP

(57) ABSTRACT

A device for preventing a signal induced by hazardous EMI on a power line in a group of multiple adjacent, parallel power lines of the same phase in an electrical power system from reaching an electrical component connected to one of the multiple power lines, the device comprising at least one conductive impedance transition element having a disk-shaped structure with multiple holes for receiving the multiple adjacent power lines of the same phase, the disk-shaped structures each having an outer diameter that is greater than diameter of all of the multiple parallel power lines to deliberately create an impedance mismatch between the conductive impedance transition elements and adjacent portions of the multiple power lines. The impedance mismatch causes the conductive impedance transition elements to reflect high-frequency components of a signal induced on the multiple power lines by hazardous EMI and the high-frequency components are reflected and dissipated as heat.

18 Claims, 26 Drawing Sheets

(56) References Cited

U.S. PATENT DOCUMENTS

| | | | |
|---|---|---|---|
| 5,483,423 | A | 1/1996 | Lewis et al. |
| 5,619,079 | A | 4/1997 | Wiggins et al. |
| 5,673,172 | A | 9/1997 | Hastings et al. |
| 6,163,454 | A | 12/2000 | Strickler |
| 8,300,378 | B2 | 10/2012 | Birnbach |
| 2003/0042990 | A1 | 3/2003 | Schumacher |
| 2004/0008527 | A1 | 1/2004 | Honda |
| 2008/0048669 | A1 | 2/2008 | Scherber |
| 2019/0230828 | A1 | 7/2019 | Murch |
| 2020/0383248 | A1 | 12/2020 | Easton |

OTHER PUBLICATIONS

Siemens Industry, Inc., "TechTopics No. 47, 7.2 kV equipment basic insulation levels (BIL)", Reference is believed to predate application priority date, Copyright 2012.

Savage et al., "The Early-Time (E1) High-Altitude Electromagnetic Pulse (HEMP) and Its Impact on the U.S. Power Grid", Metatech Corporation, Jan. 2010.

Mark H. Hopkins, Ph.D., Has The Reasonable Experimentation Doctrine Become Unreasonable?: Rethinking The Reasonable Experimentation Doctrine In Light Of Automated Experimental Techniques, 2 J. Marshall Rev. Intell. Prop. L. 116 (2002) Reference is believed to predate application priority date.

* cited by examiner

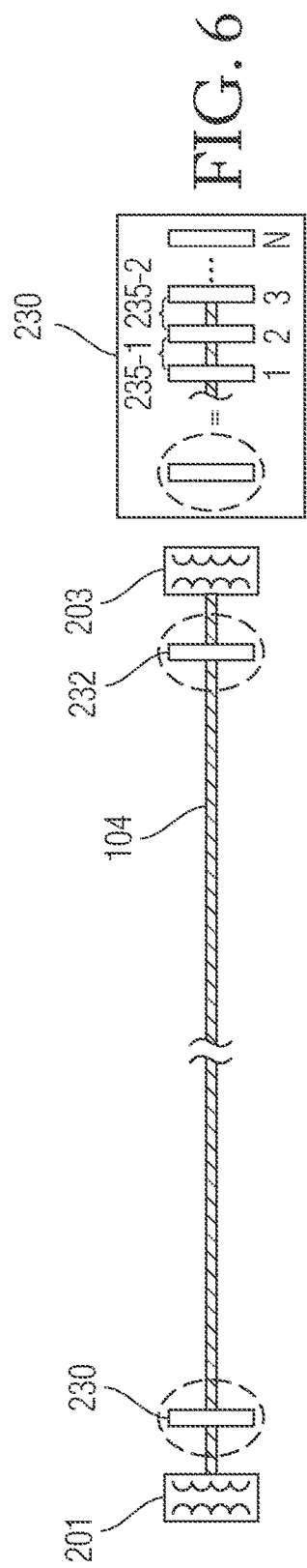
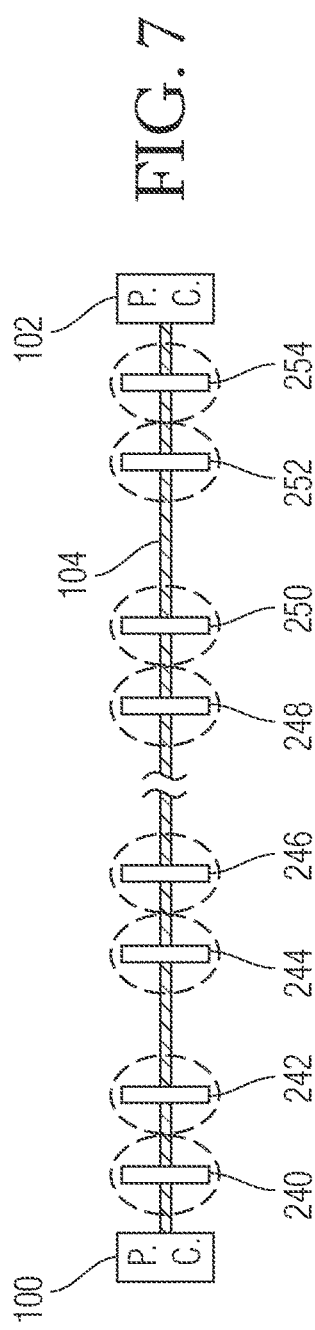
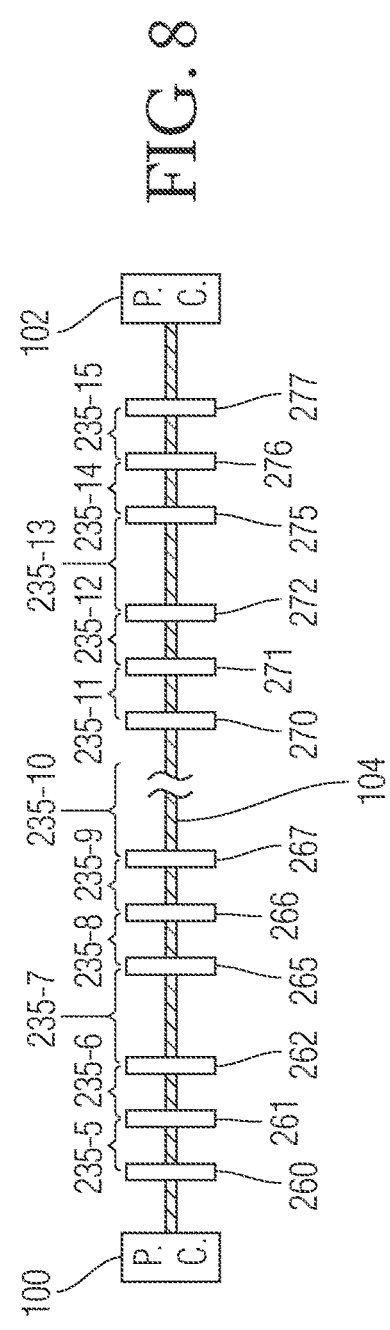

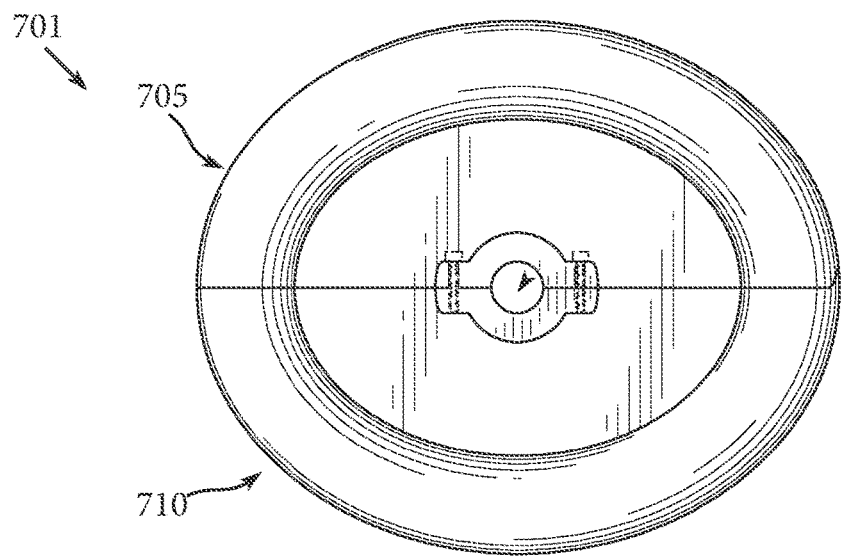
FIG. 18A
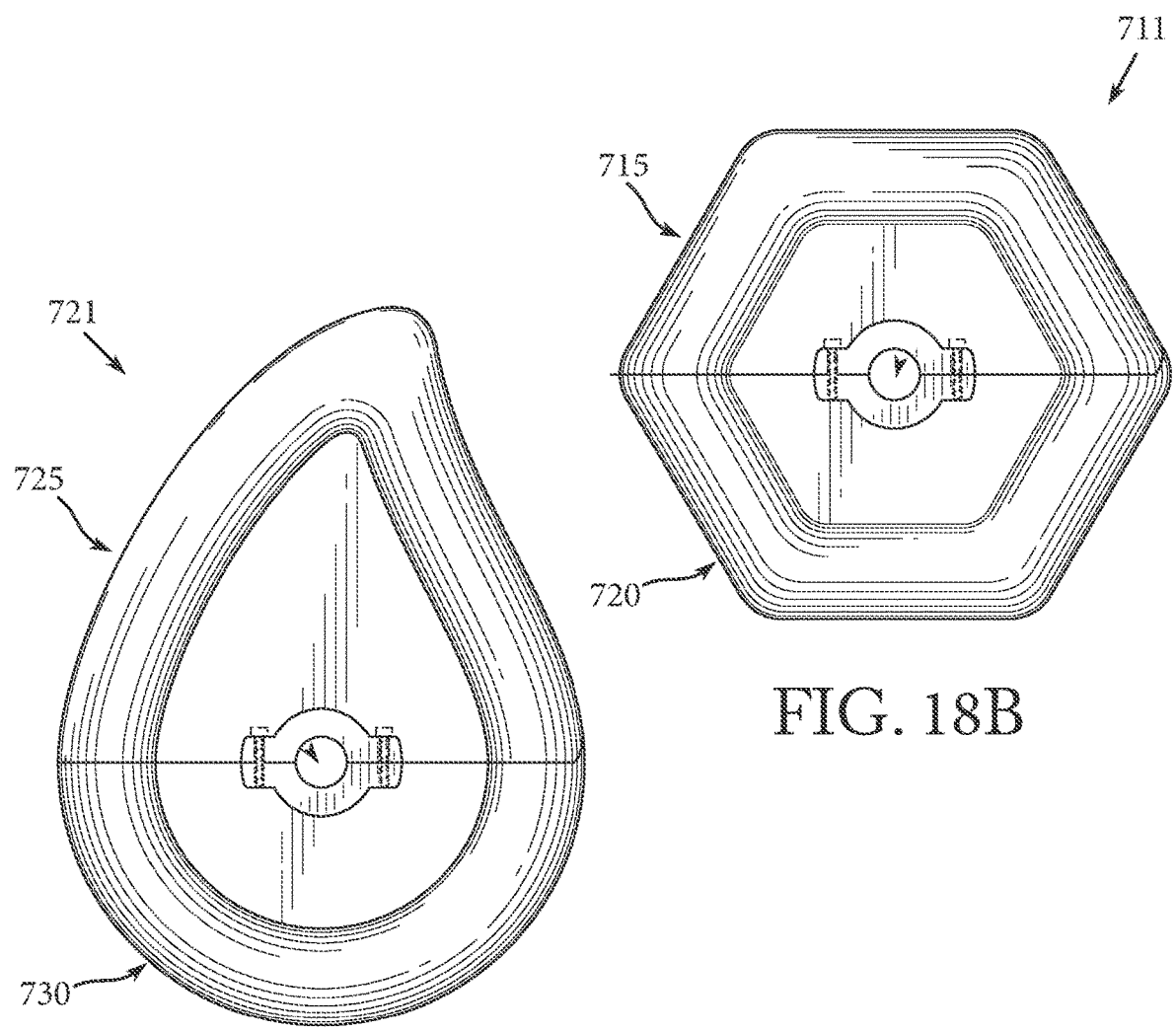
FIG. 18B
FIG. 18C

METHOD AND APPARATUS FOR PROTECTING ELECTRICAL COMPONENTS FROM A TRANSIENT ELECTROMAGNETIC DISTURBANCE TRANSMITTED ON PARALLEL POWER LINES

CROSS-REFERENCE TO RELATED APPLICATIONS

This application is a continuation-in-part of commonly-assigned and co-pending U.S. patent application Ser. No. 16/773,418 ('418 Application), filed on Jan. 27, 2020 and entitled "Method and Apparatus for Protecting Electrical Components from a Transient Electromagnetic Disturbance", and claims priority thereto.

TECHNICAL FIELD

The present invention relates to a method and apparatus for protecting electronic equipment (electrical components (EC)) from hazardous EMI including transient electromagnetic disturbances, such as an electromagnetic pulse whose origin may be a natural occurrence or man-made.

Definitions

Component: An individual electric or electronic element or a plurality of such elements connected in a defined circuit or system.

Conductive Impedance Transition Element (CITE): A conductive element coupled to a conductor that has an abrupt increase in diameter relative to the conductor.

Decaying Resonator: Two CITE elements or clusters of CITE elements positioned on a conductor with spacing in between, wherein high frequency components of an electromagnetic signal is caused to reflect back and forth between the CITE elements and continues such reflection until the signal dissipates as heat. The spacing between the CITE elements is chosen such that electromagnetic signals in a selected frequency band do not collide and add via constructive interference.

Electromagnetic Attack: A scenario wherein a hazardous EMI signal is intentionally inflicted on some electrical or electronic equipment or systems with the intent to cause damage, disruption, or confusion of said system.

Electromagnetic Interference (EMI): Electromagnetic radiation the reception of which is undesired in an electrical system as it can interfere with conveyed signals or equipment coupled to such system. EMI is defined herein as a broad term that encompasses numerous sub-types that are defined herein below.

Electromagnetic Pulse (EMP): A transient burst of electromagnetic radiation having a fast rise time of typically less than 5 nanoseconds that is hazardous and can produce potentially damaging current and voltage surges (and can thus be considered a subset of hazardous EMI). Typical EMP intensity is in the order of tens of thousands of Volts/Meter. EMP can be produced by a nuclear detonation (NEMP; risetime typically is less than 5 nanoseconds) or by non-nuclear sources that produce a suddenly fluctuating electromagnetic field such as coronal mass ejections (NNEMP; risetime typically is less than 5 nanoseconds).

Electromagnetic Threat: A circumstance wherein a hazardous and intentional electromagnetic signal may be used against electrical or electronic equipment or systems with the intent to cause damage, disruption, or confusion of said system.

Extraordinary Electromagnetic Pulses: A class of EMP which encompasses all the various electromagnetic threats described herein, as previously defined in U.S. Pat. No. 8,300,378. Extraordinary EMP includes transient pulses arising from nuclear explosions (NEMP), non-nuclear electromagnetic pulses (NNEMP) of sufficient strength to reach and render inoperative components of an electrical power system, or geomagnetically-induced current (GIC) as a result of coronal mass ejections from solar storms.

Hazardous EMI: Electromagnetic interference the receipt of which in an electrical system has a high likelihood of damaging or rendering inoperable electric equipment coupled to such system, such as, but not limited to, electrical generating equipment, electronic circuit boards and transformers. This interference may be a pulse or continuous emission.

High-altitude Electromagnetic Pulse (HEMP): Also a subset of NEMP. HEMP is produced when a nuclear weapon is detonated high above the Earth's surface (exo-atmospheric), creating gamma-radiation that interacts with the atmosphere to create an intense electromagnetic energy field that is harmless to people as it radiates outward but which can overload circuitry with effects similar to a lightning strike, but causing damage much more swiftly than a lightning strike.

High Magnetic Permeability: High magnetic permeability is defined herein as a permeability equal to or greater than $1\times10^{-3}\mu$ (H/m; absolute permeability); $>1000\mu/\mu0$ (relative permeability).

Intentional electromagnetic interference (IEMI): Electromagnetic interference intentionally (artificially) created to negatively affect a targeted electrical system. This interference may be a pulse or continuous emission.

Narrow Bandwidth EM signal: An EM signal having a bandwidth that is equal to or less than 25 percent of the central frequency.

Nuclear electromagnetic interference (NEMI): Electrical interference created by detonation of a nuclear device and having an initial risetime of less than 3 nanoseconds. NEMI includes fast rise-time electromagnetic pulses (defined below) and radiation delivered with slower rise time and longer duration. This is normally known as Electromagnetic Pulse (EMP) (see above).

Phase Lines: Two or more conductors positioned adjacent to one each other and carrying the same phase of a single or multiphase power line.

Power Line: An electrical power generation, transmission or distribution system having a power grid including multiple, synchronized sources of power generation. More particularly, the power line can comprise a "three-phase line" having three separate conductors, each of which carries a power signal in a phase-shifted relationship with the others. A fourth conductor can be neutral.

Radio Frequency (RF): Electromagnetic emissions and signals in the radio portion of the spectrum, ranging from a few KiloHertz to many TeraHertz.

Source Region Electromagnetic Pulse (SREMP): A subset of Nuclear Electromagnetic Pulse (NEMP). A SREMP is produced by low-altitude (endo-atmospheric) nuclear burst. An effective net vertical electron current is formed by the asymmetric deposition of electrons in the atmosphere and the ground, and the formation and decay of this current emits a pulse of electromagnetic radiation in directions perpendicular to the current. The asymmetry from a low-altitude explosion occurs because some electrons emitted downward are trapped in the upper millimeter of the Earth's surface while others, moving upward and outward, can travel long distances in the atmosphere, producing ionization and charge separation. A weaker asymmetry can exist for higher altitude explosions due to the density gradient of the atmosphere.

System Generated EMP (SGEMP): SGEMP is a special class of EMP signal that occurs as a result of energy reflecting within an equipment enclosure. It is usually associated with and found within missiles but can occur elsewhere. It is unique in that it is a secondary form of EMP emission.

Ultrahigh Bandwidth EM signal: An EM signal having a bandwidth that is greater than or equal to 75 percent of central frequency of the signal.

It is noted that NEMP, HEMP, SREMP, SGEMP, and others are all electromagnetic pulses derived from the explosion of a nuclear device (fission, fusion, thermonuclear fusion). All are typified by extremely fast risetimes, typically less than 5 nanoseconds, and can have risetimes in the sub-nanosecond range. All these EMP types, as well as the Non-Nuclear EMP class (NNEMP) produce pulses that are typified by an extremely broad RF Bandwidth, typically ranging from a few KiloHertz to several GigaHertz. It is further noted that the signal level at any individual frequency across this portion of the spectrum is not uniform, but the bulk of the energy is located below around 200 MegaHertz. These boundaries are not fixed and are determined by a number of parameters that exist at the moment of the creation of said pulse.

BACKGROUND

It is well known that certain events can produce electromagnetic radiation pulses that can be extremely destructive to electrical infrastructure. The term used herein for this broad category of electromagnetic radiation is "hazardous electromagnetic interference (EMI)." In light of concerns regarding the spread of nuclear weapons and similarly destructive technology, research has been conducted to study the effects of the powerful burst of hazardous EMI emitted by nuclear detonations (NEMI). Research has shown that nuclear detonations generate bursts of electromagnetic pulses (EMP) with extremely fast rise-times (on the order of less than 5 nanoseconds), followed by slower, longer-lasting portions of the signals which can last for a long period of time, sometimes extending into minutes. One of the main determining factors in the ultimate shape of any nuclear derived EMP pulse is the altitude at which it is detonated. Typical EMP intensity is in the order of tens of thousands of Volts/Meter. This compares with the order of 200 Volts/Meter for nearby radars, 10 Volts/Meter for communication equipment, and 0.01 Volts/Meter for typical metropolitan area ambient. It is also noted that Federal Communication Commission (FCC) guidelines mandate a limit of 0.5 Volts/Meter at the edge of the property line of the transmission cite for emissions of this sort.

Some of the characteristics of EMP which result in a threat to electrical equipment are extremely fast risetime, extremely short pulse width, and field amplitude which gives rise to a signal with broad frequency spectrum. There are three basic mechanisms for EM coupling to a conducting structure: electrical induction, the basic mechanism for linear conductors; magnetic induction, the principal mechanism when the conducting structure forms a closed loop; and signal transfer through the earth (i.e. the physical planet). Devices which may be susceptible to functional damage due to electrical transients include active electronic devices, passive electronic components, semiconductor devices, squibs and pyrotechnic devices, meters, and power systems, cables, electrical power grid switching and distribution elements. Operational upset and damage can be expected in digital processing systems, memory units, guidance systems, and power distribution systems. Damage mechanisms include dielectric breakdown, thermal effects and interconnection, switching, transformer and generator failures.

The spectral and energy distributions of a nuclear EMP of any type primarily depends on how high in the atmosphere that the detonation takes place. Detonations that occur 40 km or less above the earth's surface, termed endo-atmospheric detonations, produce Source Region Electromagnetic Pulses (SREMP), while detonations that occur 40 km or above the earth's surface, termed exo-atmospheric detonations, produce High Altitude electromagnetic pulses (HEMP). SREMP is generated by collisions between photons from gamma radiation and molecules of the atmosphere. These highly energetic photons eject electrons from the surrounding air molecules, producing ionized air molecules. This immense separation of charge creates an intense E-Field which can be as high as several 100,000 Volts/Meter and has a large associated H-Field which can be as high as 5000 Ampere-turns/Meter. FIG. 19A is a graph of an exemplary EMP waveform generated by an exemplary 100 KiloTon endo-atmospheric detonation over time. In FIG. 19A, the start of the waveform (E1) of the SREMP is an extremely powerful pulse that rises to a maximum which can be as high as 250 KV/Meter in approximately 1 nanosecond and falls to approximately 10 KV/Meter within 10 nanoseconds. In the scenario identified above, the electric field remains approximately constant at 10 KV/Meter in the second portion of the waveform (E2) which lasts from the 10 nanosecond mark to about 100 µs after the detonation. In the third portion of the waveform (E3) which begins at about 100 µs after the detonation, the electric field drops from 10 KV/Meter to about zero by the 1 millisecond mark. FIG. 19B is a graph of the relative energy of the SREMP waveform versus frequency. As shown, the frequency content of the SREMP waveform lies in a frequency range below 1 MHz, with the vast majority of the spectral content lying below 10 kHz. It is noted that the exact field strengths, pulse risetimes, and duration depend upon a combination of multiple factors including device geometry, device yield, height of explosion, and atmospheric conditions at the time of detonation.

In contrast, a HEMP is generated by gamma photons being absorbed by atmospheric molecules at altitudes above 40 Kilometers. This absorption causes electrons to be deflected by the earth's magnetic field into a spiral path about the field lines, causing them to radiate electromagnetic energy. FIG. 20A is a graph of an EMI waveform generated by an exemplary exo-atmospheric detonation over time. As shown, the waveform of the HEMP is drastically different from its SREMP counterpart. For devices in the 5 KiloTon to 1 MegaTon range, this electron radiated energy creates a large, diverse E-Field in the range of tens of KiloVolts/Meter and an associated H-Field in the range of 10 to 300 Ampereturns/Meter. Parts of the HEMP waveform can be of longer duration that SREMP, possibly lasting several seconds. As noted above, durations of specific parts of the waveform depend on a number of factors including device geometry, device yield, height of explosion, and atmospheric conditions at the time of detonation. FIG. 20B is a schematic graph of the relative energy of the HEMP waveform versus frequency. As shown, about ninety percent of the energy is contained in the 100 KHz to 10 MHz range.

EMP Versus Lightning

As mentioned above, the apparatus and methods disclosed herein protect against hazardous EMI including fast risetime electromagnetic pulses (EMP) as well as relatively slower lightning strikes. For example, EMP arising from endo-atmospheric denotations (SREMP) have a rapid rise time (typically sub-nanosecond) and short pulse duration (500 nanoseconds or less). This EMP has a substantial electrical field strength that is typically, but not limited to, the range of 10 KV/meter to 500 KV/meter. Electrical pulses in power lines generated by lightning behave in a similar fashion to SREMP pulses, but have a slower risetime, typically around 20 nanoseconds, and a longer pulsewidth than nuclear, or other artificially created EMP. The consequence of this is that the low-Q decaying resonators tend to be slightly less effective in suppressing a transient induced signal from lightning than they are in suppressing a transient induced signal from SREMP or non-nuclear sources. However, by adjusting the Q-factor of the decaying resonators in various embodiments and arrangements it is possible to target extremely short EMP (SREMP) or longer-pulse EMP (e.g., lightning) depending upon which type of EMP is deemed to be the more important threat at a particular power line.

Conventional Protective Schemes

It should be noted that the majority of electromagnetic attack scenarios involve more than a single pulse being used in said attack. The consequence of this is that in order for a protective scheme to be viable, it must be able to withstand multiple sequential electromagnetic attacks, possibly in close succession in order for such a protective scheme to be considered as a viable means of protection. Some protective schemes are single shot or potentially single shot and thus are not truly suitable for protection service, in spite of their current widespread use.

As noted above, in addition to the hazardous EMI generated by nuclear donations (SREMP and HEMP), electrical and electronic equipment can be damaged by other events such as non-nuclear electromagnetic pulse, intentional electromagnetic bursts, coronal mass ejections (solar storms) and lightning storms. Certain measures have been devised to protect electrical systems from hazardous EMI. For example, conventional systems and devices for suppression of hazardous EMI such as EMP and lightning include, but are not limited to: electron tube protective devices, metal oxide varistor and other solid state devices, spark gaps, and inductors.

Electron Tube Protective Devices: The inventor of the present application has previously developed protective means utilizing high speed high power cold cathode field emission electron tubes as a preferred means for protecting electrical and electronic equipment from damage due to any of the aforementioned electromagnetic threats. Such protective cold cathode field emission electron tubes are described in U.S. Pat. No. 8,300,378 "Method and apparatus for protecting power systems from extraordinary electromagnetic pulses" by Birnbach. Testing of this class of electron tube device has shown it to be suitable for protective service in repetitive pulse applications with pulse repetition rates to over 500 KiloHertz.

Metal Oxide Varistors (MOVs): MOVs are solid state devices which, in their resting state, exhibit very high impedance, typically of, but not limited to, 10 MΩ-100 MΩ. When a voltage is applied across a MOV in excess of some predetermined threshold, the MOV changes its internal impedance to a very low impedance state. This allows the MOV to be used to shunt overvoltages around critical circuit components. The speed at which this change of impedance occurs is a function of the specific design and material content of said MOV. A significant limitation of MOV devices is that, since they are semiconductors, once a fault in the crystalline structure of the substrate occurs, MOVs cannot be repaired and they do not self-heal. The foregoing type of fault is the predominant failure mode of MOVs. As a result, MOVs cannot be relied on to provide protection for more than one overvoltage event. MOVs are currently the primary surge suppression means used by the public utilities in spite of this limitation.

In addition, care needs to be taken in specifying a MOV because most MOVs do not have a sufficiently fast risetime (typically approximately 20 nanoseconds) to be useful in suppressing EMP from a nuclear explosion (NEMP), particularly the E1 portions of SREMP and fast-rise time portions of HEMP. Even MOVs having fast reaction times adapted for high rise times (approx. 2-5 nanoseconds risetime) are still too slow to be effective against all E1 pulses which typically have sub-nanosecond rise times. This speed differential allows a devastatingly large amount of energy to pass before the protective action occurs, resulting in failure of the protected device and frequently of the protective device (MOV) as well. Therefore, MOVs are generally not effective against NEMP.

There are some MOVs on the market which claim to be suitable for use protecting against pulses in excess of 5,000 Amperes, even though their connecting wires are less than 0.125 inches (⅛") in diameter. If the pulse were sufficiently short, less than one nanosecond in duration, the connecting wires might not evaporate, but in any real-world electromagnetic attack scenario, the wires would evaporate thus rendering the device useless. It should be obvious to the person of ordinary skill in the art that the use of such devices is inadequate to provide protection against real-world electromagnetic threats.

Other Semiconductor Devices: It is noted that there are a variety of other semiconductor devices in use or in development for the transient suppression application. An example of this is the gallium nitride Avalanche Diode. This is a fast risetime switching diode with sufficiently robust parameters that when several are used together, in either series or parallel depending on the specific application, the speed of the group is slower than the speed of individual devices due to parasitic inductances and capacitances introduced by the interconnections and the mandatory balancing network. All relevant semiconductor devices are subject to failure due to failure of the crystal structure associated with the piezoelectric effect. Semiconductor devices of this class are subject to the same failure modes as MOV devices as discussed previously.

Spark Gaps: A Spark Gap is a form of a fast switch which is sometimes used for hazardous EMI protection. A spark gap is wired to shunt the overvoltage around sensitive components. The threshold voltage is determined by the spacing of the electrodes of the spark gap. A problem with spark gaps is getting them to trigger reliably at some predetermined voltage. A further problem is that once fired, the contact surfaces of the spark gap degrade by erosion, causing a change in the electrode spacing, and subsequent firing events are usually not at the same voltage as when the spark gap is new. Spark gaps require very high maintenance and their use is generally restricted to laboratory pulse power experimentation. Another form of spark gap that is used exclusively by the electric power distribution and transmission industry is a set of specifically spaced curved rods, often referred to as "horns." While too slow in risetime for protection against fast-rise time EMP, horns have been shown to be a simple approach for lightning protection and are widely used. Their major disadvantage is that they are easily damaged and require frequent replacement.

Inductors: can suppress fast transient signals when wired in series with a circuit. The problem with the use of serially connected inductors as protective devices is that the electrical insulation requirements and the tolerance of the diameter of the conductor in the inductor, which relates to its ability to handle certain amounts of current without overheating, are very strict, and serial inductors alone are generally not capable of adequately suppressing hazardous EMI signals. The ability of an inductor to withstand multiple repeated pulses is a function of its design, specifically the insulation and thermal ratings. Inductors consume energy and are usually only used in sub-stations where surplus energy is readily available.

Therefore, a need remains for a method and device that can reliably and efficiently overcome the foregoing deficiencies and protect electronic equipment from hazardous EMI.

SUMMARY

The present disclosure provides a device for preventing an electrical signal induced by hazardous EMI on one or more power lines in a group of multiple adjacent, parallel power lines of the same phase in an electrical power generation, transmission, and distribution system from reaching an electrical component connected to one of the multiple parallel power lines. The device comprises at least one conductive impedance transition element, the at least one conductive impedance element comprising a disk-shaped structure having multiple holes being dimensioned and spaced apart from one another so as to receive and surround one of the multiple adjacent power lines of the same phase, the disk-shaped structures each having an outer diameter that is greater than diameter of all of the multiple parallel power lines to deliberately create an impedance mismatch between the conductive impedance transition elements and adjacent portions of the multiple power lines. The impedance mismatch causes the conductive impedance transition elements to reflect high-frequency components of a signal induced on the multiple power lines by hazardous EMI, and the high-frequency components are reflected and dissipated as heat.

The present disclosure further provides a method of protecting a component coupled to a power line, of a group of multiple parallel power lines of equivalent phase, of an electrical power generation, transmission and distribution system from hazardous EMI. The method comprises deliberately creating an impedance mismatch by mounting at least one conductive impedance transition elements (CITEs) having a diameter greater than a diameter of the power line on all of the power lines of equivalent phase at a position between an extended length of the power line and the component. A difference between the diameter of the CITEs and the power line intentionally causes an impedance mismatch between the two or more conductive impedance transition elements with adjacent portions of the power line, the impedance mismatch causing high-frequency components of a signal induced on the power line by the hazardous EMI to be reflected and dissipated by decaying resonators formed between pairs of the plurality of conductive impedance transition elements.

The magnitude of the impedance mismatch is dependent upon a frequency and permits low frequency components of the induced transient electromagnetic signal to pass by the plurality of conductive impedance transition elements while reflecting high-frequency of the induced transient electromagnetic signal from the plurality of impedance transition element.

To increase the efficiency of the conductive impedance transition elements, one or more of the plurality of such conductive impedance transition elements can be composed of or include sections of ferrite material. Such ferrite materials can be incorporated either as a separate disk unit or integrated into a conductive disk element.

It is noted that one or more of the CITEs may be constructed of partially or semi conductive materials, such as carbon, graphite, etc. This allows the disk to absorb a portion of the incident energy. Such absorbing CITEs may be used individually, in evenly spaced sets, in unevenly spaced sets, and other configurations as would be understood by a person of ordinary skill in the art.

BRIEF DESCRIPTION OF THE DRAWING FIGURES

In the following drawing figures, like reference numbers refer to like parts.

FIG. 6 is a schematic view of another embodiment in which CITEs according to the present disclosure are used on a power line having a first protected component (100) and a second protected component (102).

FIG. 7 is similar to FIG. 6, showing more general locations of CITEs protecting the component on the left and more general locations of CITEs protecting the component on the right.

FIG. 8 is a schematic view of another embodiment in which CITEs are arranged in groups of three (235) along the power line.

FIG. 18A is a plan view of another embodiment of a CITE having an elliptical cross-sectional shape.

FIG. 18B is a plan view of another embodiment of a CITE having a polygonal cross-sectional shape.

FIG. 18C is a plan view of another embodiment of a CITE having an asymmetrical cross-sectional shape.

Figure 20A:
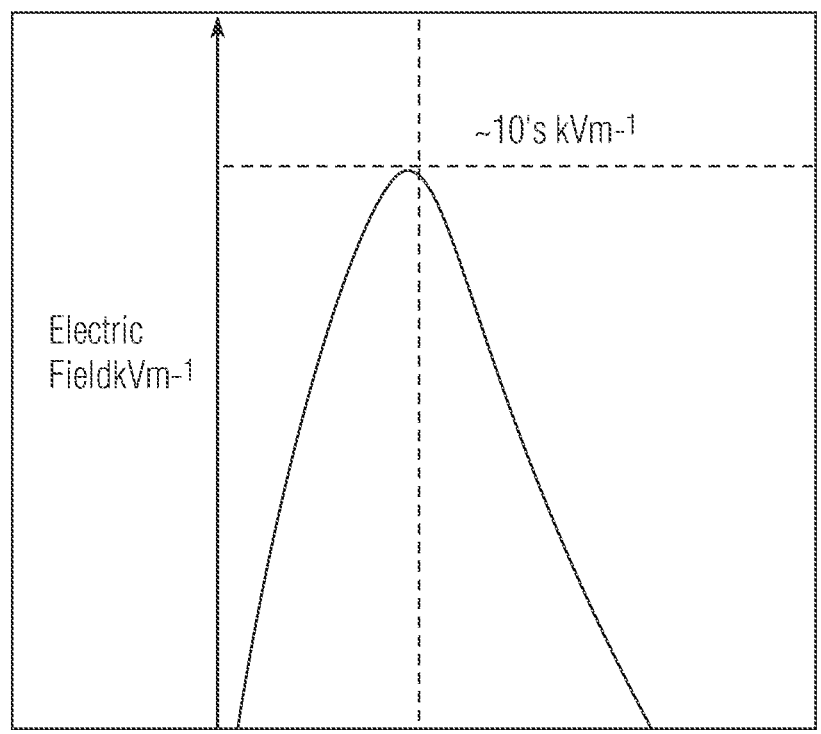
FIG. 20A is a graph of an EMI waveform generated by an exemplary exo-atmospheric (HEMP) detonation over time. (From Sandia).
Figure 20B:
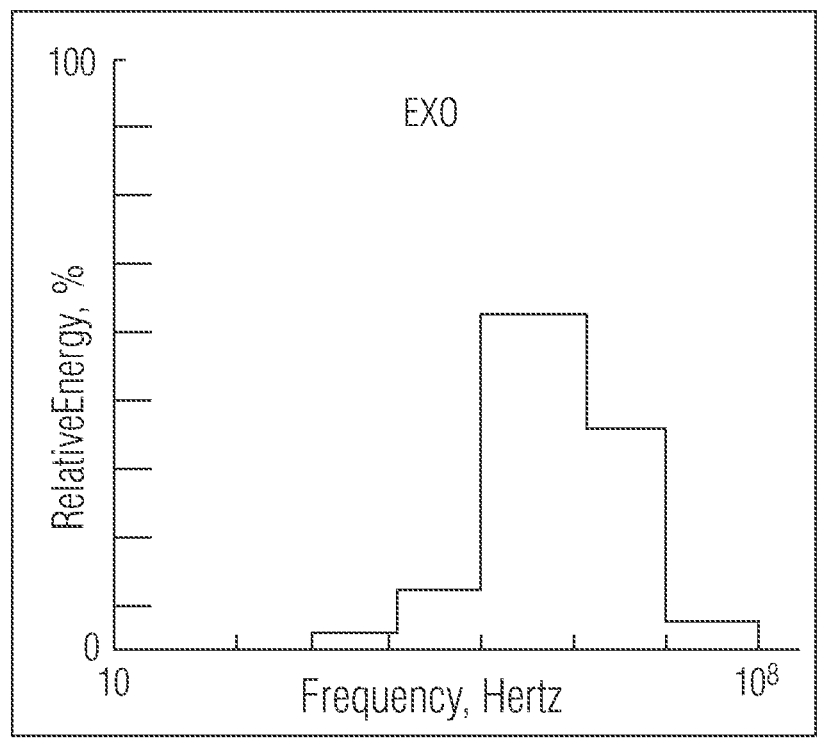

FIG. 20B a graph of the relative energy of the HEMP waveform versus frequency. (From Sandia).

Figure 21:
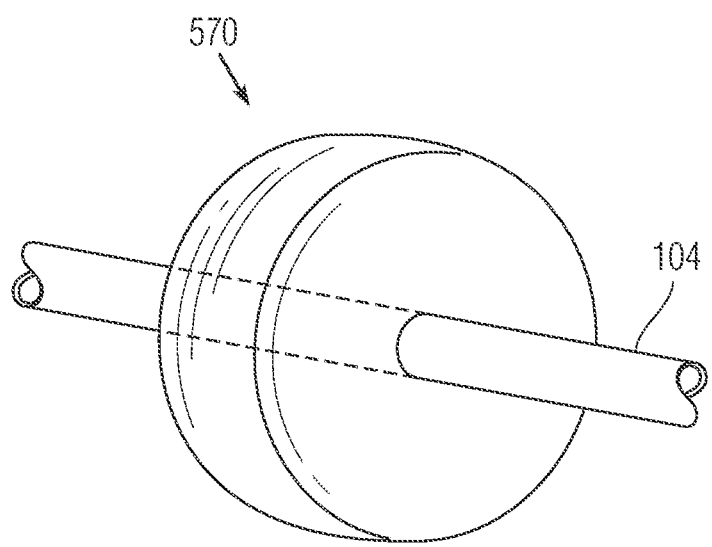

FIG. 21 is a perspective view of another embodiment of a conductive impedance transition element (CITE) according to the present disclosure formed as a ferrite bead.

Figure 22A:
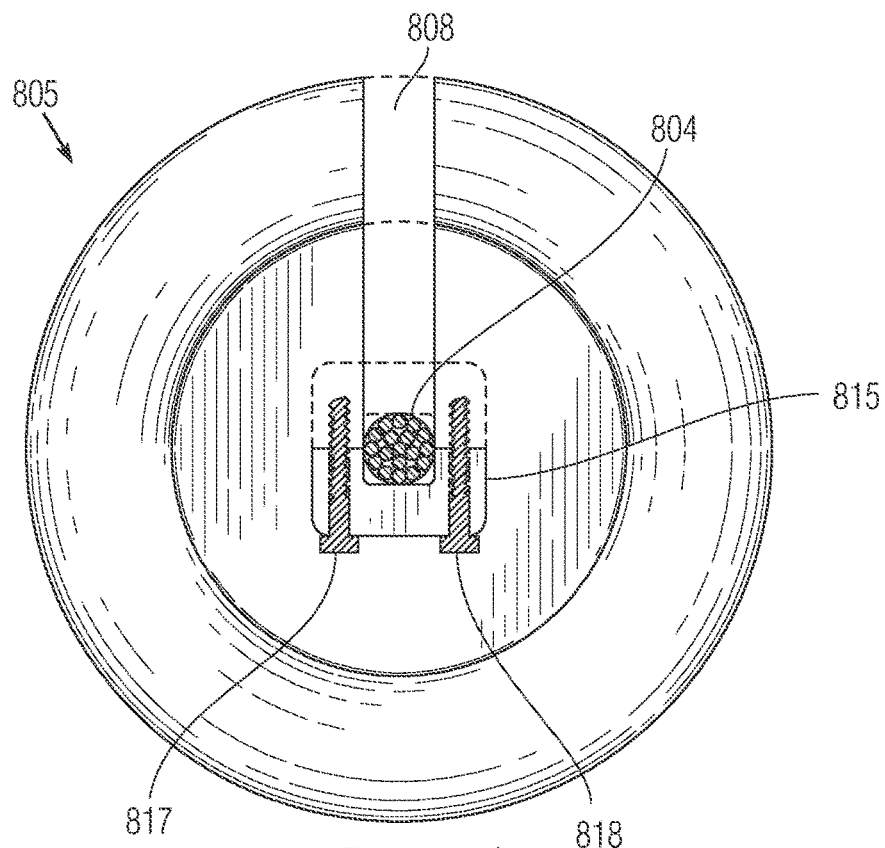
Figure 22B:
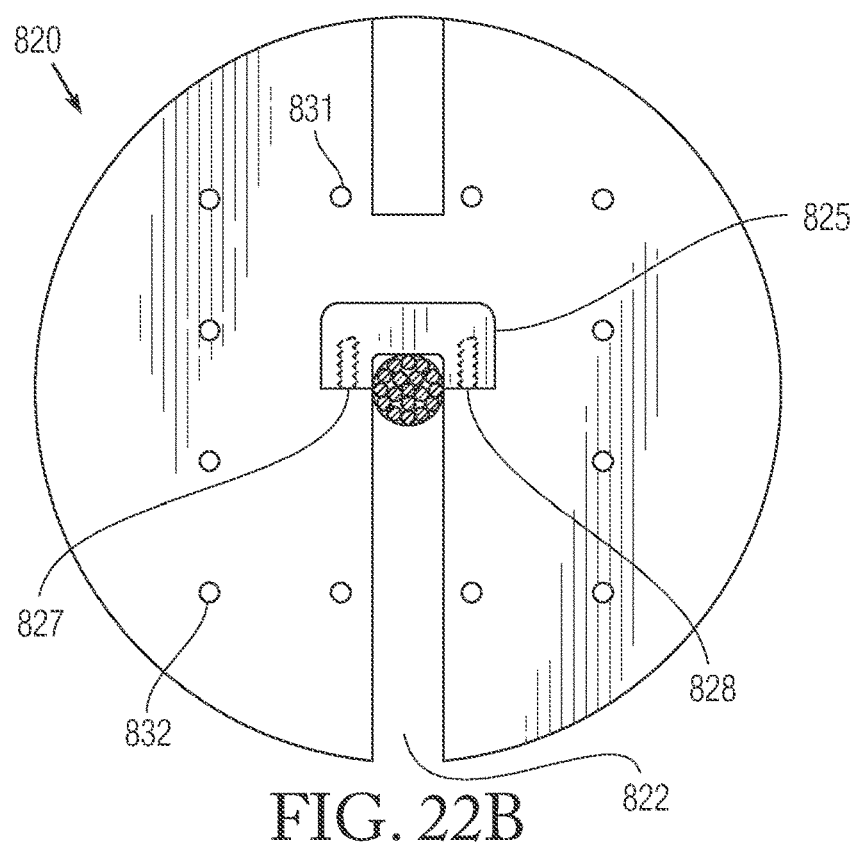

FIGS. 22A and 22B are plan views of longitudinal sections of a CITE, illustrating one embodiment of a method of assembling a CITE according to the present disclosure.

Figure 23:
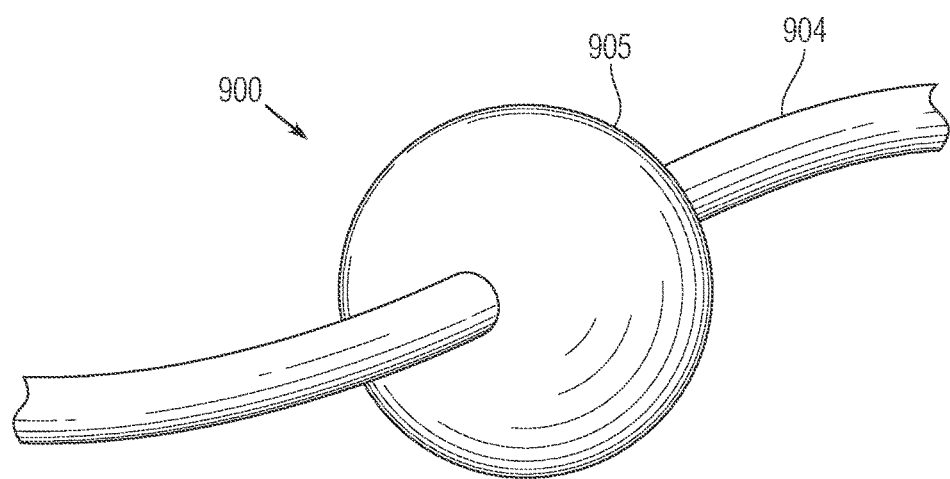

FIG. 23 is a perspective view of an alternative embodiment of a CITE, having a spherical shape.

Figure 24:
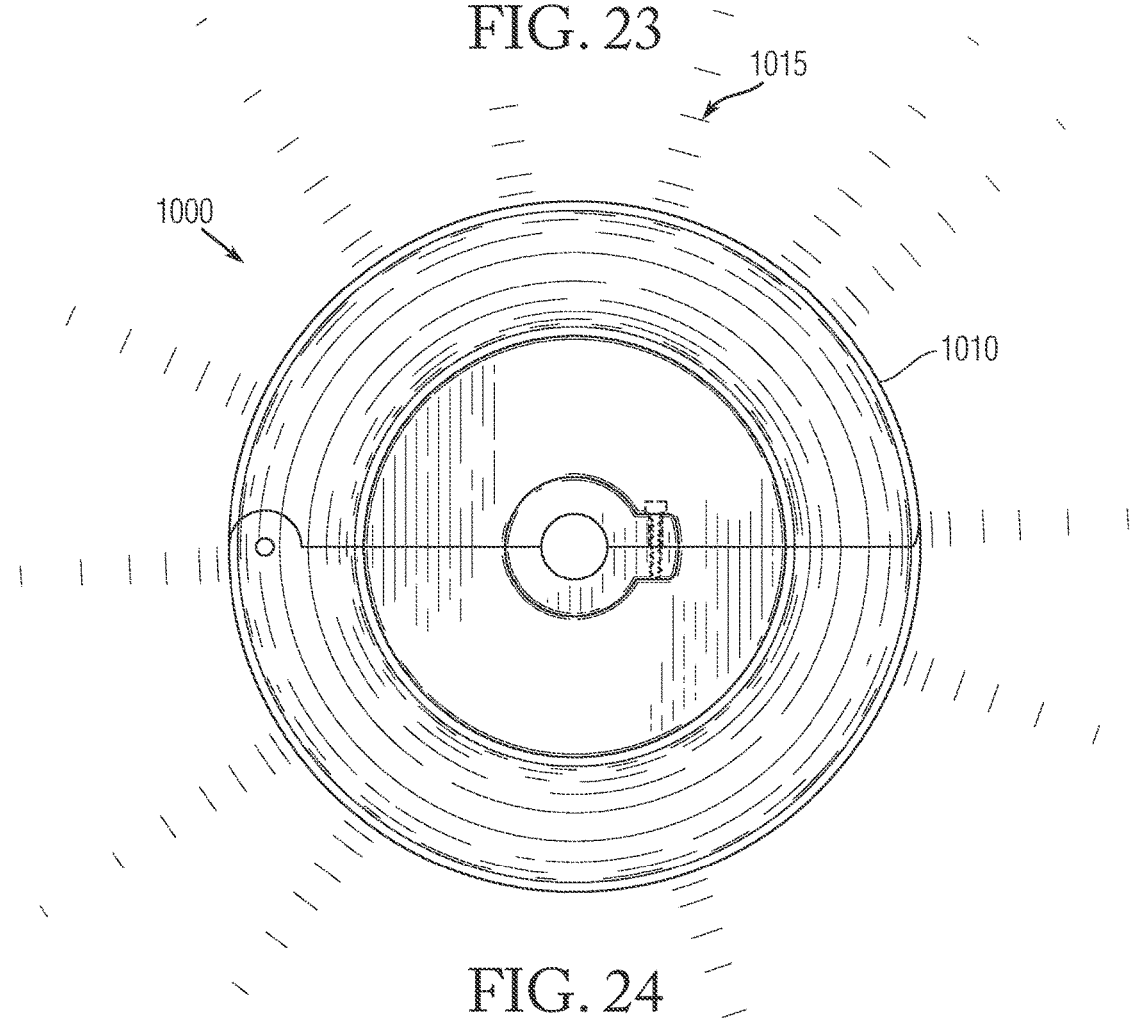

FIG. 24 is a front plan view of a CITE having a transparent outer peripheral section filled with a fluorescent gas.

Figure 25A:
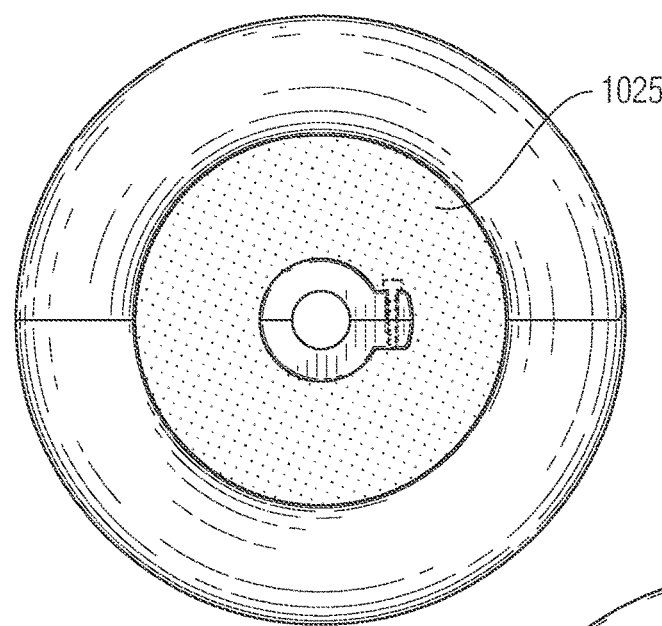
Figure 25B:
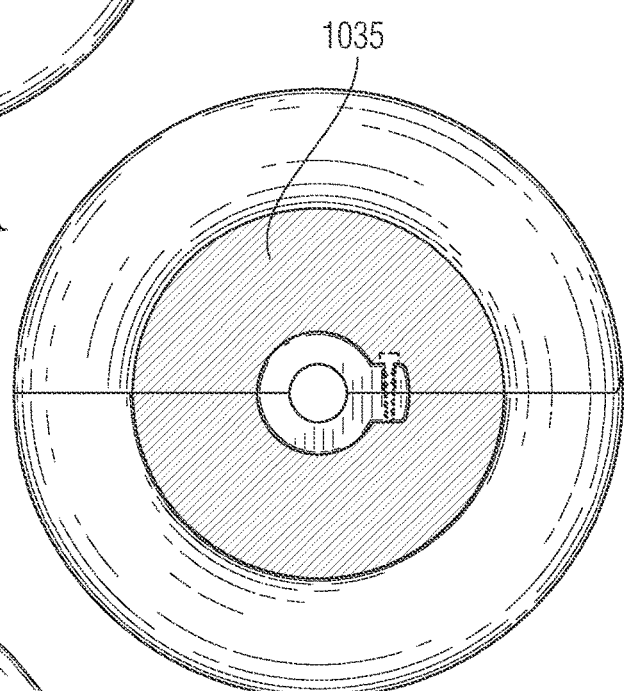
Figure 25C:
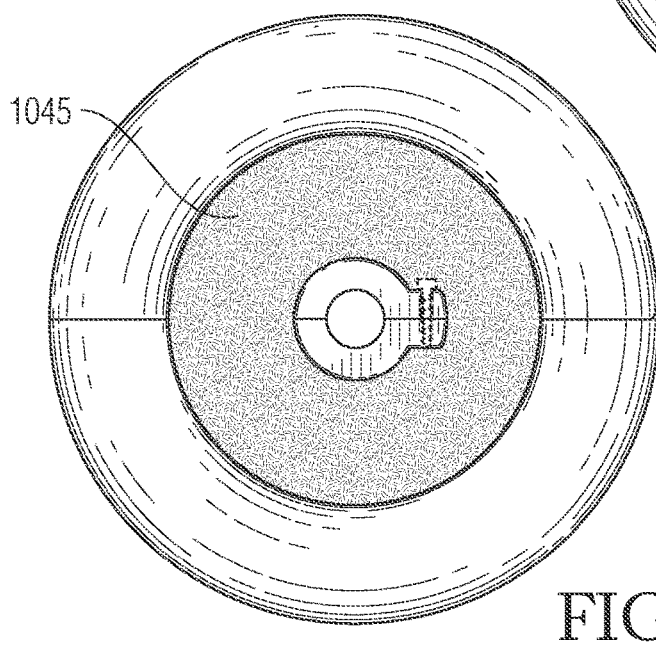

FIG. 25A-C show embodiments of CITE having central sections formed different materials, respectively, an absorptive material such as graphene (FIG. 25A), a metal such as aluminum (FIG. 25B), and a ferritic material (FIG. 25C).

Figure 26A:
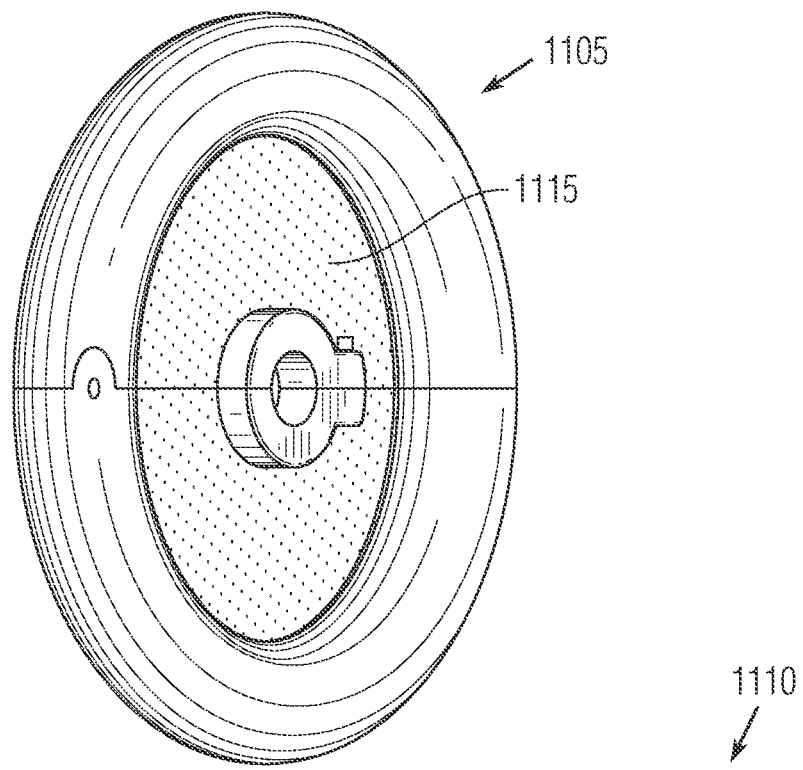

FIG. 26A is a perspective view of a first side of another embodiment of a CITE according to the present disclosure having a metallic central portion.

Figure 26B:
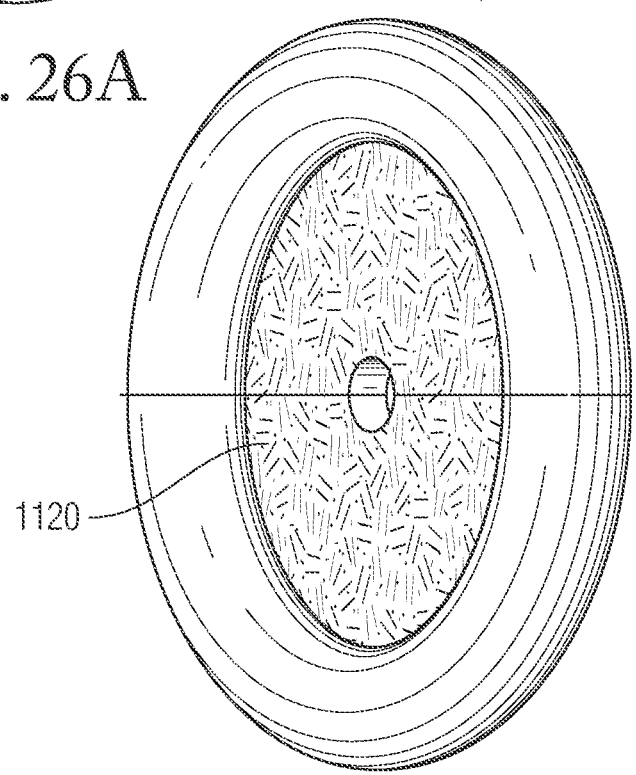

FIG. 26B is a perspective view of a second side of another embodiment of a CITE according to the present disclosure having an absorptive central portion.

Figure 27A:
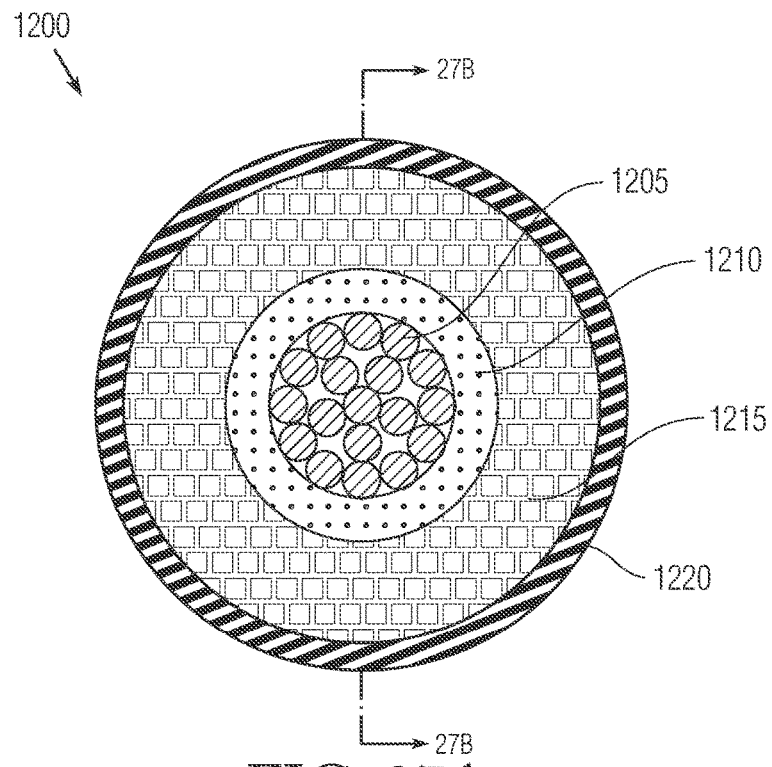

FIG. 27A is an axial cross-sectional view of an underground coaxial power cable having a semiconductor layer with differential impedance along the length of the cable.

Figure 27B:
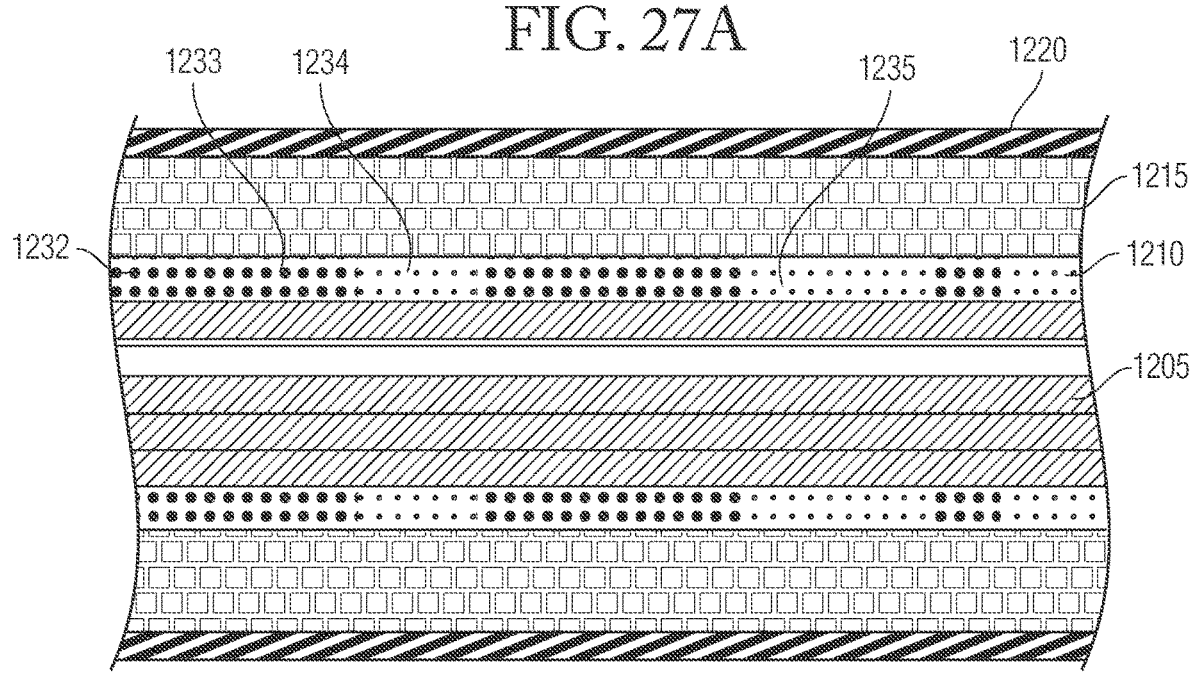

FIG. 27B is a longitudinal cross-sectional view of the underground coaxial power cable shown in FIG. 27A.

Figure 28A:
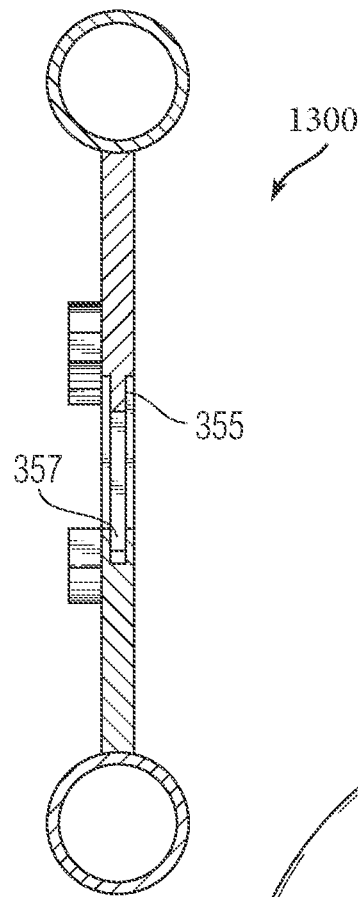

FIG. 28A is a side view of another embodiment of a CITE having a tongue and groove for securing upper and lower components of the CITE.

Figure 28B:
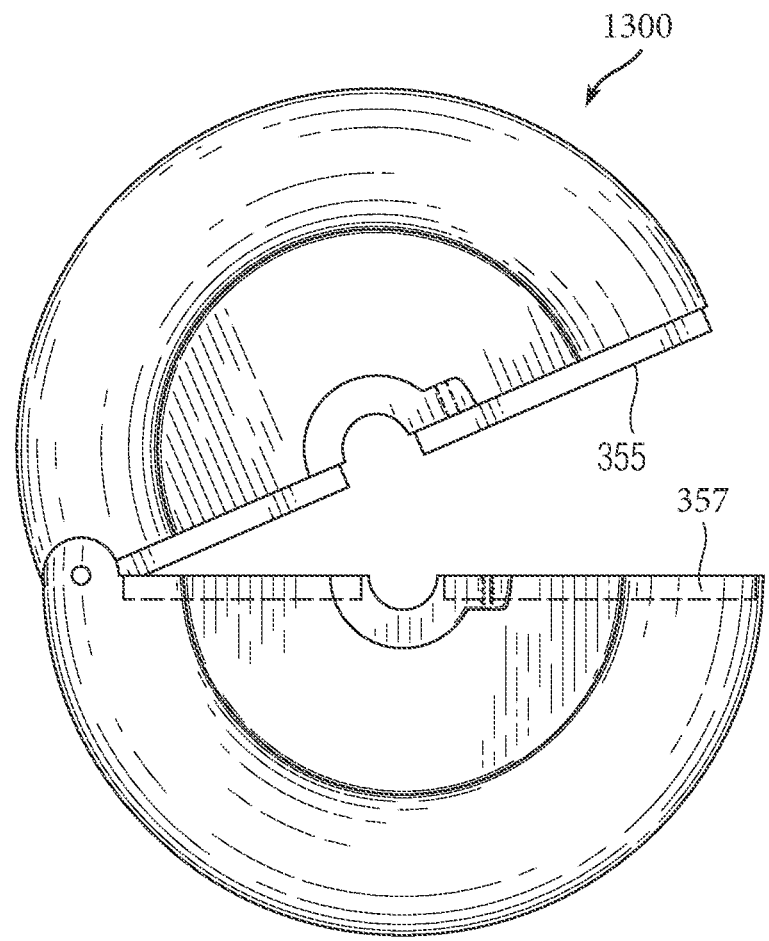

FIG. 28B is a front plan view of the embodiment shown in FIG. 28A.

Further features and advantages of the invention will become apparent from reading the following detailed description in conjunction with the following drawings, in which like reference numbers refer to like parts. The drawings and portions thereof are illustrative and are not necessarily drawn to scale.

Figure 29A:
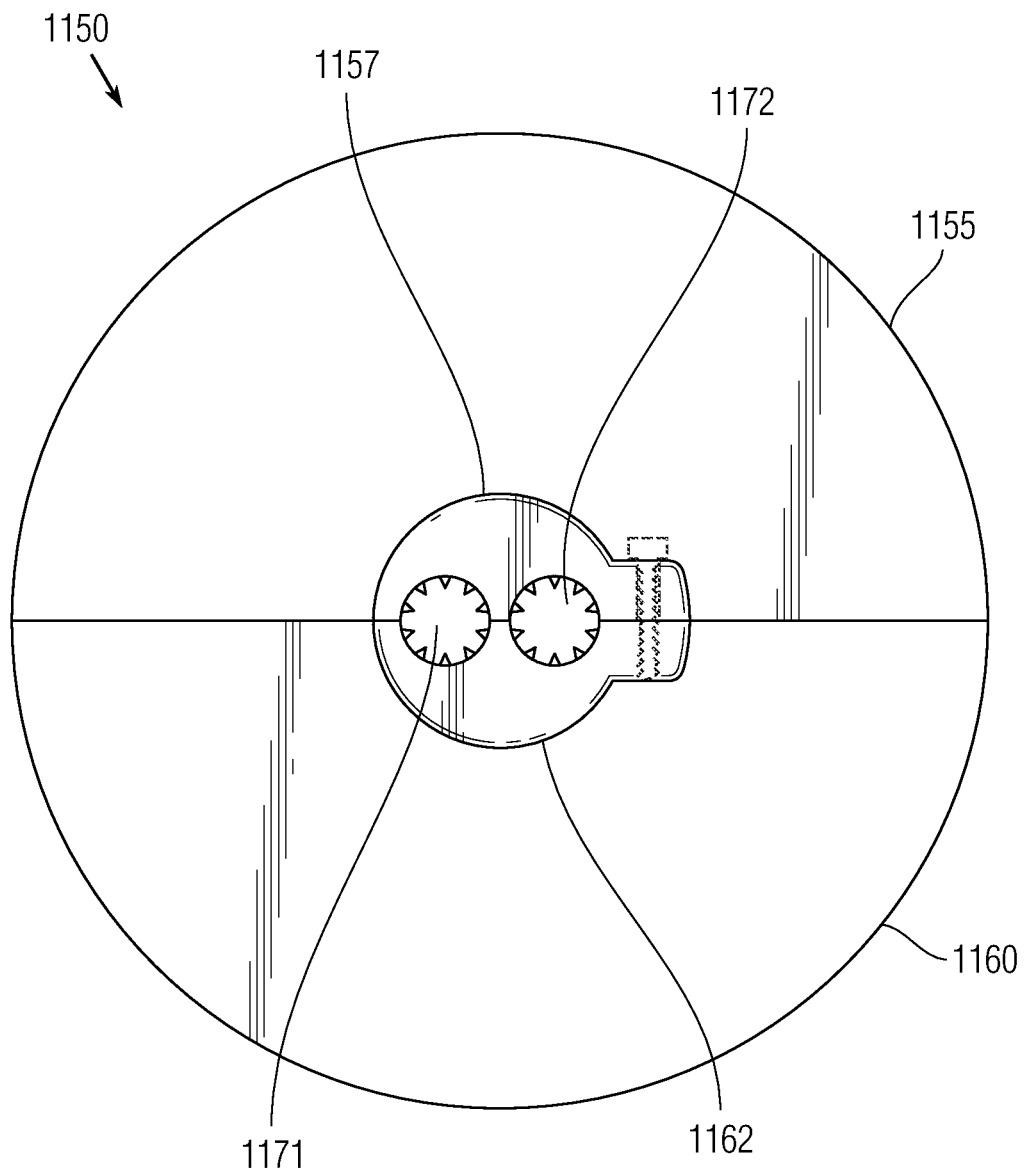

FIG. 29A is a front plan view of an embodiment of a CITE adapted for parallel phase lines.

Figure 29B:
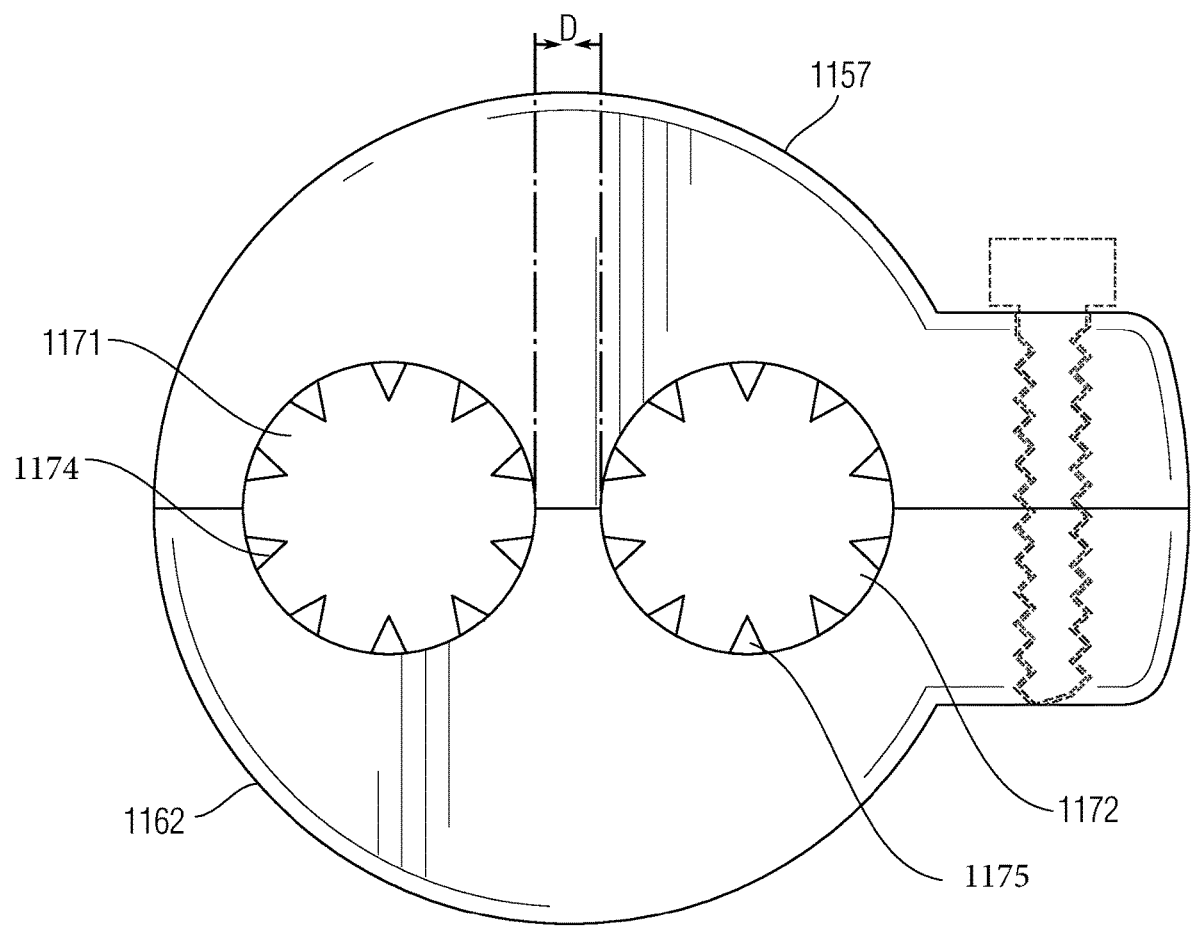

FIG. 29B is an enlarged view of the central portion of the CITE shown in FIG. 29A.

Figure 30:
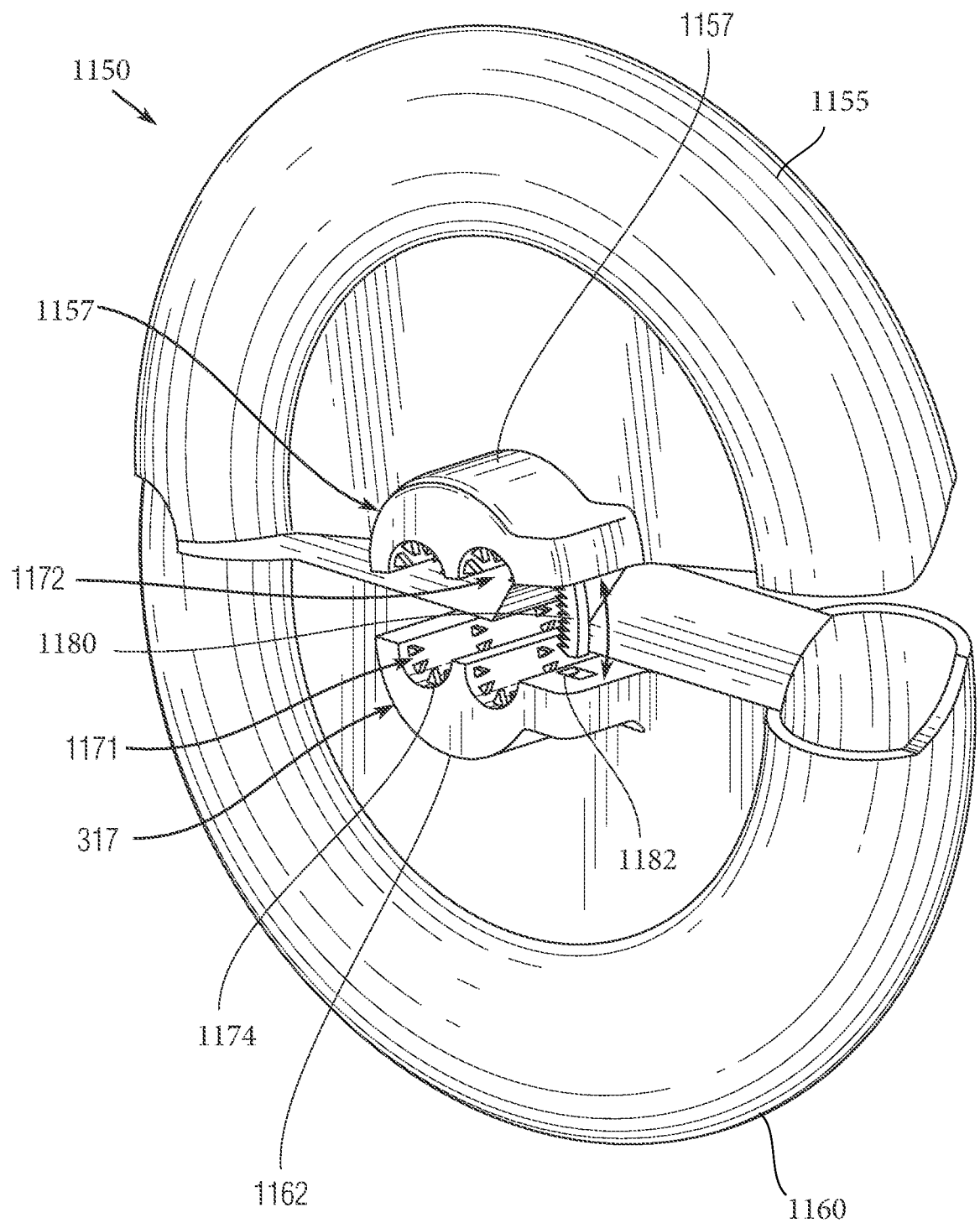

FIG. 30 is perspective view of the CITE shown in FIG. 29A.

Figure 31:
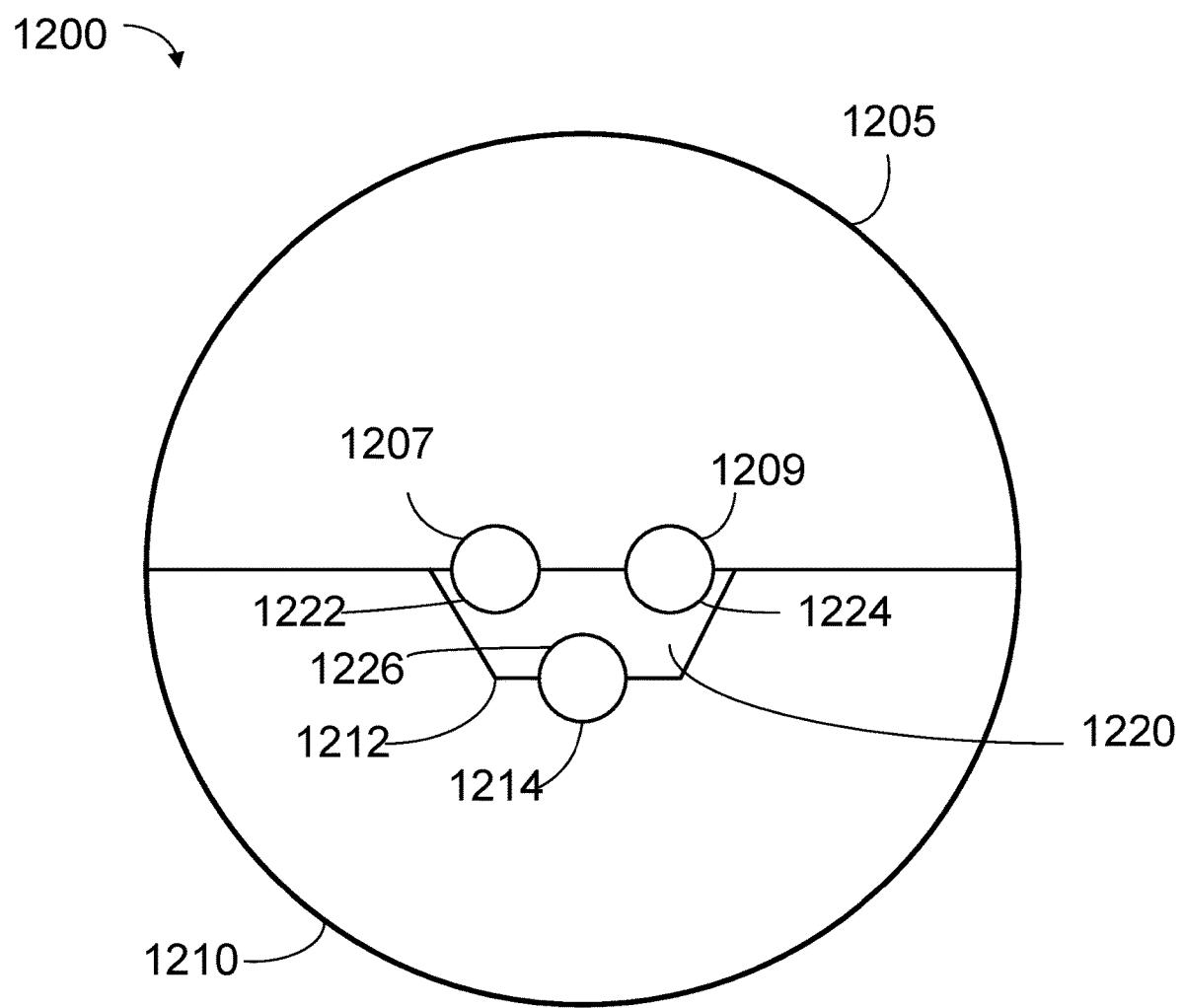

FIG. 31 is a front plan view of another view of an embodiment of a CITE adapted for three phase lines.

Figure 32:
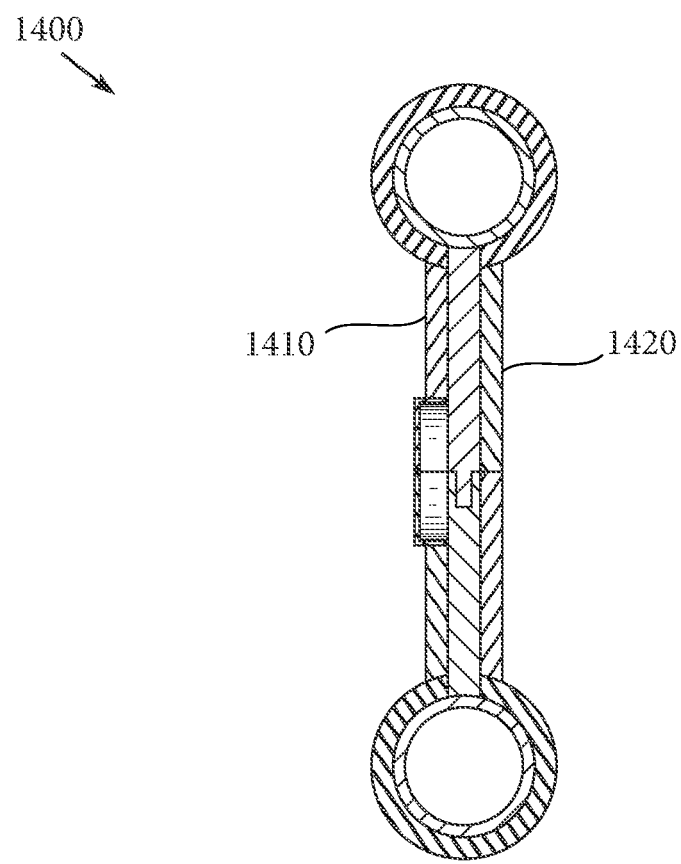

FIG. 32 is a cross-sectional side view of an embodiment of a CITE having a Mu-metal coating.

DETAILED DESCRIPTION

The devices (systems) and methods disclosed herein are configured to protect electronic equipment, electrical components, and systems thereof from hazardous EMI including transient electromagnetic pulses (EMPs).

As mentioned previously, EMP was first noted in conjunction with nuclear explosions; however, in recent years, it has become possible to generate EMP signals, comparable to or in excess of those generated by nuclear explosions, by electrical means (man-made weapons and simulators). Electromagnetic pulses of concern are those in the range of typically but not limited to the range of 10 KV/meter to 500 KV/meter or higher. The apparatus and methods disclosed herein protect electrical infrastructure against hazardous EMI including EMP arising from nuclear (NEMP) and non-nuclear (NNEMP) sources.

Deliberately Created Impedance Mismatch

The disclosed apparatuses (systems) and methods utilize the principle of reflection of a significant portion of incoming hazardous EMI by deliberate mismatch of impedances along a specified type of power line, where said hazardous EMI can be in the form of EMP or interference signal. Such "power line," as used herein, can be that of an electrical power generation, transmission or distribution system having a power grid including multiple, synchronized sources of power generation. More particularly, the power line can comprise a "three-phase line" having three separate conductors, each of which carries a power signal in a phase-shifted relationship with the others. A fourth conductor can be neutral. However, the systems and method can apply generally to the full range of phases used in electrical power distribution system ranging typically from one to six or more in some cases. The number of phases in a system has no bearing on the use of CITEs technology other than imposing a constraint that every phase including neutrals shall be equipped with one or more CITEs devices or sets of said devices, Reflections of significant portions of a hazardous EMI signal can protect electrical components from being damaged and rendered inoperative by such signal. The intentional mismatch of frequency dependent impedance is realized by incorporating conductive impedance transition elements (CITEs) on the power line. The CITEs can be thought of as being conductive attachments to the power line. The conductive attachments (CITEs) can have the same cross-sectional shape as the power line but have a diameter that is a number of times larger than the diameter of the power line.

Consider, for example, the total low frequency inductance of an element of circular cross-section, which is $$L_{dc} = 2l * [\ln(2l/r) - 0.75]$$

where:

$L_{dc}$ is the "low-frequency" or DC inductance in nanoHenries (nH or $10^{-9}$H);

l is the length of the element or structure in cm;

r is the radius of the element or structure in cm.

(E. B. Rosa, "The Self and Mutual Inductances of Linear Conductors", Bulletin of the Bureau of Standards, Vol. 4, No. 2, 1908, page 301ff.) The reactance (i.e., type of impedance) of an inductor is $$X_L = 2\pi f L$$

from which it can be seen that a change to the radius of an element, leads to an inductance (L) change, which, in turn, causes proportional changes in impedance ($X_L$). The term "f" here is the frequency of the signal input to the inductor. In other words, an intentional change in variable r (radius of the power line) due to the presence of an CITE on a power line to r+x, in which x represents the positive diameter change of the CITE over r, will cause a corresponding intentional mismatch of impedance between an CITE and an adjacent length of power line having the original value of r. The equation above also indicates that any mismatch in impedance due to differences in L is multiplied by the frequency value, with higher mismatches at higher frequencies.

As one non-limiting example, if the power line comprises a 1-inch diameter wire, the CITE can be configured as a disc having a 15 to 20 inch diameter. This embodiment is suited for use in conventional power line settings in which multiple power lines are typically strung side-by-side or one over another with sufficient distance between the power lines. In particular, there are standards well known to persons of ordinary skill in the art that dictate the distance that separates each power line from another. It will be appreciated that since the CITE has a greater width (diameter) than the power line, the CITE extends outwardly from a power line toward adjacent power lines. To avoid arcing or any other detrimental effects of having two conductors in close proximity, a sufficient distance needs to be maintained between the outward edge of the CITE and the adjacent power line or the peripheral edge of any CITE on the adjacent power line. Since power lines can sway away from their tethering, shortening the distance between the adjacent lines, an extra tolerance is added to account for this phenomenon as well. In some implementations, in the event of power lines that are spaced approximately 18 inches apart, the perimeter edge of the CITE is positioned a prescribed distance from the adjacent power line, such as approximately 6-12 inches. It is noted that it is a relatively simple matter to increase the distance separating the individual lines in a power transmission system to allow for the installation of CITEs hardware.

Apart from the considerations regarding the spacing between power lines, the diameter of the CITEs also depends on the voltage level of the power line. The higher the voltage used on the power line, the greater should be the diameter of the CITEs mounted to the power line.

As discussed herein, exemplary implementations of the CITE include arrangements of two or more CITEs conjoined together as a unit and placed along the power line. The efficiency of the overall system can be based, at least in part, on the number of CITEs, or groups of CITEs, and the spacing of said CITEs and groups of CITEs, that are arranged in a predetermined fashion along the power line.

Impedance mismatches result in standing waves along the transmission line, a voltage standing wave ratio (VSWR) is defined as the ratio of the partial standing wave's voltage amplitude at an antinode (minimum) to the voltage amplitude at a node (maximum) along the line. The VSWR is a measure of the impedance match (or mismatch) of electrical sources and loads to the characteristic impedance of an electrical transmission line. A high VSWR caused by the deliberate mismatch of impedances between the CITEs or groups of CITEs and power line causes reflection of the high-frequency components (MHz to GHz range) of the incoming hazardous EMI signal (e.g., EMP), but only weakly affects the much lower fundamental frequency components of the current signal (e.g., 50-400 Hz) that supplies electrical power on the power line. The reflection of the high-frequency components of the transient signal is done to prevent (1) the destructive consequence due to voltage higher than the design voltage of such components reaching and rendering inoperative a magnetic-winding containing electrical component connected to the power line, such as a transformer, generator or motor by thermal or insulation damage, and/or (2) the destructive consequence of such high-frequency components reaching and rendering inoperative any deployed switchgear components for interrupting current in the power line. It is noted that other failure mechanisms are possible.

Implications of Destructive and Constructive Interference

It is noted that it is possible to deliberately create a situation where there is destructive or constructive interference of the reflected transient signals in said power line. It is important that consideration be given to this matter when designing a CITEs system. Further, it is desirable to optimize the CITEs system to deliberately create destructive interference of the high frequency components to allow them to cancel themselves out independently of the normal operation of the CITEs system.

To ensure destructive interference, it is required that the spacing of the CITEs at opposite ends of the power line not be of a magnitude that gives rise to constructive interference. In the case of installations where the protected line can be powered down, a simple test can be conducted to determine the optimum spacing, In this test, a direct injection pulse source of suitable risetime, pulse width and amplitude is capacitively coupled to the power line after installation of the CITEs structures. A high speed oscilloscope with a minimum of 1 GHz instantaneous bandwidth is coupled to the line on the other side of one of the CITE structures. A pulse is injected and the waveform is observed. If the pulse is reduced in amplitude as compared to a sampled pulse from the injection side of the power line, then the spacing is appropriate. If the pulse is greater, then one set of CITE structures needs to be moved until the minimum pulse size is observed. This test is also how a power line is certified to verify proper operation of the CITE structures.

Figure 1:
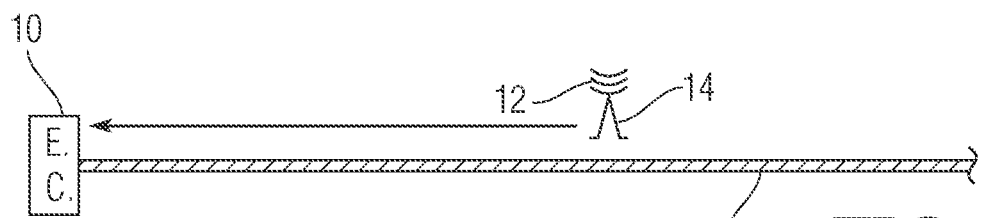
FIG. 1 is a schematic, prior art view of an electrical component (E.C.) which is connected to a power line (104) and which is susceptible to damage from a transient electromagnetic interference signal (14).

FIG. 1 is a schematic view of a system, not to scale, in which an electrical component (E.C.) (electrical or electronic equipment) 10 is connected to a power line 104 of an electrical power generation, transmission, and distribution system according to the prior art. Power line 104 is shown with cross-hatching to indicate that it is electrically conductive. An external hazardous electromagnetic signal 12 (hazardous EMI), such as an electromagnetic pulse (EMP), induces an electromagnetic signal on power line 104 as a pulse 14, which is directed to electrical component (E.C.) 10. The electrical component (E.C.) 10 will be rendered inoperative if the magnitude of the voltage pulse 14 that reaches the electrical component (E.C.) 10 is too high by one or more failure mechanisms previously mentioned.

Figure 2:
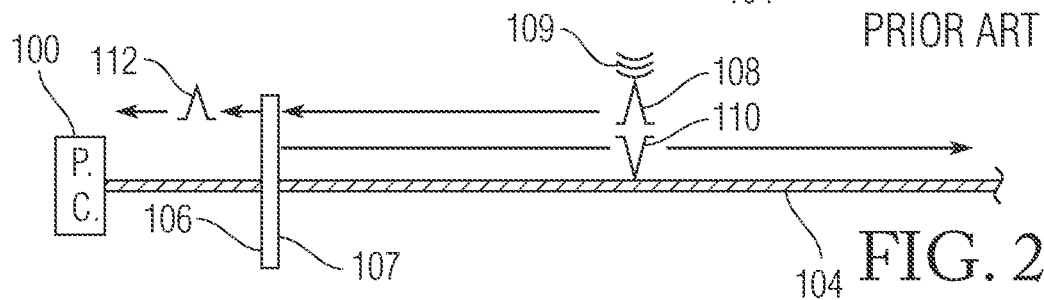
FIG. 2 is a schematic view, not to scale of a power line with an electrical component that is protected (P.C.) by at least the one illustrated conductive impedance transition element (CITE; 106, 107) from the destructive consequence of a transient electromagnetic interference signal according to the present disclosure.

FIG. 2 shows a schematic view, not to scale, of a protected component 100 (shown as "P.C." in the figures), a power line 104 and a single conductive impedance transition element (CITE) 106. CITE 106 introduces a deliberately-created frequency dependent mismatch of impedance along a power line 104 as a means or technique to protect the protected component (P.C.) 100 from the effects of a hazardous EMI. Representative CITE 106 is shown schematically, and more detailed embodiments are described below and illustrated in subsequent figures. The CITE 106 is electrically conductive (e.g., is formed of or is coated with a metal such as aluminum, copper, stainless steel, a ferrite, some combination thereof, or other conductive material) and has a first side 107 that faces away from the protected component (P.C.) 100 towards a length of power line 104. Generally, the CITEs are structured such that one side of the element maximizes the diameter ratio between the element and the power line, which is termed the "first" side. During installation, the first side of the CITE is installed to face away from the protected component. There is an abrupt impedance mismatch between the first side 107 of the CITE 106 and an axially adjacent portion of power line 104. It is noted that a single CITE will not give 100% reflection of the unwanted high frequency components, and to achieve this, a more complex structure, such as is shown in FIGS. 3-8 is required and is described below. It is noted that FIGS. 2-5 refer to one end of the power line with a single protected component. It is also noted that all signals travel on the conductor of the power line even though they are shown spatially displaced from the power line for the sake of clarity.

A potentially damaging EMI signal 108 is induced (or in some cases, injected) on power line 104 by an external hazardous EMI 109 (e.g., EMP) that impacts the power line 104. Signal 108 is also referred to herein as being a "transient induced signal 108". The deliberate impedance mismatch introduced by the presence of the CITE 106 along the power line 104 causes the first side 107 of CITE 106 to reflect a first portion 110 of the transient induced signal 108 away from protected component (P.C.) 100. Reflected portion 110 is inverted in polarity compared to the transient induced signal 108 due to the mentioned reflection. A second portion 112 of lesser amplitude of transient induced signal 108 is transmitted toward the protected component 100. The first portion 110 which is transmitted away from the protected component is much larger (in amplitude) than the second portion, with the ratio being a function of the degree of impedance mismatch. It should be understood that FIG. 2 is simplified (as are similar figures) in regard to the depiction of a transient electromagnetic interference signals and depictions of transmitted and reflected portions of transient electromagnetic interference signals. In FIG. 2, for instance, transient induced signal 108 and the reflected first portion 110 of the transient induced signal appear to travel along separate paths, shown as separated by a vertical distance. However, these signals 108, 110 actually travel in opposite directions along overlapping paths that include power line 104. Furthermore, only a few, representative transmitted and reflected portions of a transient electromagnetic interference signal 108 are shown in FIG. 2 (and in similar figures), for simplicity of illustration. It is noted that the configuration of FIG. 2, while viable and operable, is not the preferred embodiment and is provided here, largely for exemplary purposes.

The design and placement of CITE 106 (and any other CITEs) on power line 104 is intended to assure that the voltage applied across protected component (P.C.) 100 is sufficiently low as to avoid the destructive consequence of rendering such component inoperative. As mentioned above, the frequency dependent impedance mismatch (due to the CITE 106) also avoids reflection of voltage on power line 104, at the fundamental frequency of the current that supplies electrical power on the power line, away from protected component (P.C.) 100. Such fundamental frequency may typically be 50, 60 or 400 Hz, for example.

One useful guideline for determining a maximal threshold voltage for the portion 112 of the transient induced signal 108 that is transmitted to the protected component (P.C.) 100 is the transnational standard "Basic Insulation Level" (BIL), which is used globally as a metric for protecting electrical components coupled to the electrical grid. As is known, the insulation of equipment of a system must be designed to withstand a certain minimum voltage before an impulse (e.g. lightning impulse) overvoltage gets discharged through surge protecting devices and the like. Therefore, the operating voltage level of surge protecting devices should be lower than the minimum voltage withstanding level of the equipment. This minimum voltage rating is defined as the BIL or basic insulation level of the electrical equipment. Often, the BIL is six to seven times higher than the operating voltage level of surge protecting devices to fully ensure that the electrical equipment is protected. It is noted that the multiple for BIL is dependent on the operating voltage and decreases as the operating voltage increases.

Thus, the one or more CITEs are positioned sufficiently proximate to the protected equipment (P.C.) 100 such that the portion 112 that passes through the CITE(s) to the protected equipment (P.C.) 100 is within the BIL rating (or some other set criteria or threshold) for such equipment.

As also discussed herein, the protected component (P.C.) 100 can take any number of different forms across a wide spectrum of applications. For example, the protected component (P.C.) 100 can be in the form of a residence (home) or a subcomponent thereof or can be in the form of industrial power equipment, such as substation or generator, etc.

Figure 3:
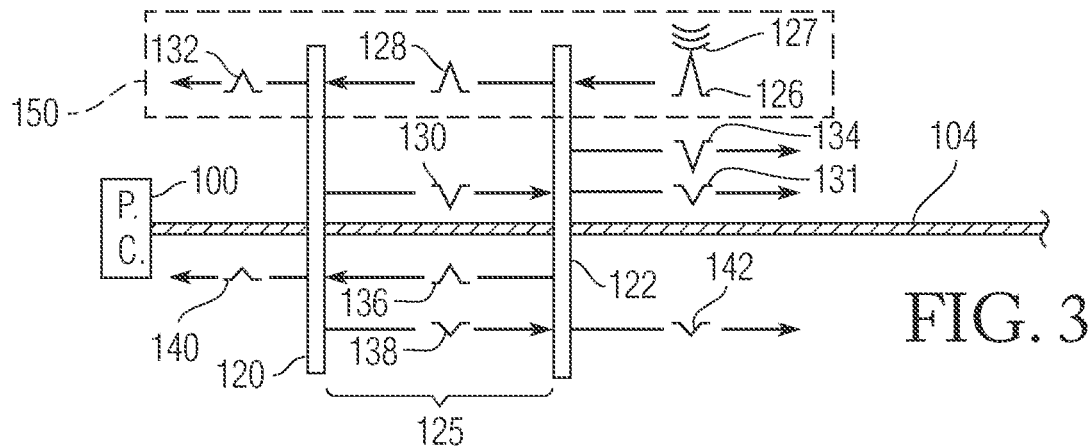
FIG. 3 is a schematic view of another embodiment according to the present disclosure in which a power line is protected by two CITEs (125).

FIG. 3 shows another embodiment of a power line 104 onto which two CITEs 120, 122 are coupled. Each CITE 120, 122 has a first side that is oriented away from the protected component (P.C.) 100, and a second side oriented toward the protected component (P.C.) 100. The first side of CITE 120 and the first side of CITE 122 face each other across a section of the power line 104 and form a decaying resonator 125 for dissipating energy of the transient induced signals. A transient induced signal 126 is induced on the power line 104 by an external hazardous EMI 127. A portion of transient induced signal 126 passes to the left through CITE 122 as a transmitted portion 128. Another portion of the transient induced signal is reflected from the second side of CITE 122 as a reflected portion 134. A portion of transmitted portion 128 that passes through CITE 122 is reflected to the right from the first side of CITE 120 as a reflected portion 130. A portion of the reflected portion 130 passes through CITE 122 as a transmitted portion 131. Another portion of transmitted portion 128 passes to the left through CITE 120 as transmitted portion 132. The transmitted portions of the signal from the receipt of the hazardous EMI 127, through induced signal 126 and transmitted portions 128, 132 to protected component 100 are encircled by dashed box 150.

A portion of reflected portion 130 is reflected to the left from the first side of CITE 122 as further reflected portion 136. A portion of reflected portion 136 passes to the left through CITE 120 as transmitted portion 140. Another portion of reflected portion 136 is reflected to the right from the first side of CITE 120 as further reflected portion 138. As the signal is reflected, the further reflected portions are attenuated compared to incident portions. For example, reflected portion 138 is attenuated compared to reflected portion 136. A portion of reflected portion 138 passes to the right through CITE 122 as a transmitted portion 142. The main transmitted components of the induced signal starting with portion external hazardous EMI 127, and including the induced signal on the power line 126, the portion 128 of signal 126 transmitted initially through CITE 122, and the portion 132 of signal 128 that is transmitted through CITE 120, are outlined in a dashed rectangular box 150. It will be appreciated that the terminology "left" and "right" is used only for convenience in describing the system shown in FIG. 3 and the relative arrangement of parts and relative direction of travel of the various signals.

As discussed herein, the CITEs 120, 122 can be spaced apart from one another a prescribed distance the value of which depends upon a number of operating parameters, such as the type of power line 104, etc. As described below, the CITEs can be constructed so as to provide an internal spacer or guide that automatically positions the CITEs at the desired distance apart from one another.

It can be appreciated from FIG. 3 and the foregoing paragraph that an initial transmitted portion causes a cascade of further reflected portions; and in particular, the transmitted portion 128 causes reflected portion 130, which, in turn, gives rise to the further reflected portion 136, which further gives rise to further reflected portion 138. FIG. 3 schematically illustrates each of the reflected portions becoming successively diminished in intensity. As a result, CITEs 120 and 122 form a decaying resonator 125 for harmlessly dissipating energy of a transient induced signal resulting from exposure to hazardous EMI.

In FIG. 3, signals 131, 134 and 142 travel from CITE 122 to the right along the power line 104, where their energies are harmlessly dissipated as heat in the power line. Within decaying resonator 125, the decaying resonant reflections of portions of transient induced signal 126 also dissipate harmlessly as heat in power line 104. The respective voltages of portions 132 and 140, directed from CITE 120 to protected component 100 are kept sufficiently low to avoid rendering protected component 100 inoperative and/or damaged. It should be appreciated that the spacing of the CITEs can allow either constructive or destructive interference; but it would be obvious to those of ordinary skill in the art that constructive interference at the frequencies of interest is to be avoided (see the discussion of constructive and destructive interference above).

Figure 4:
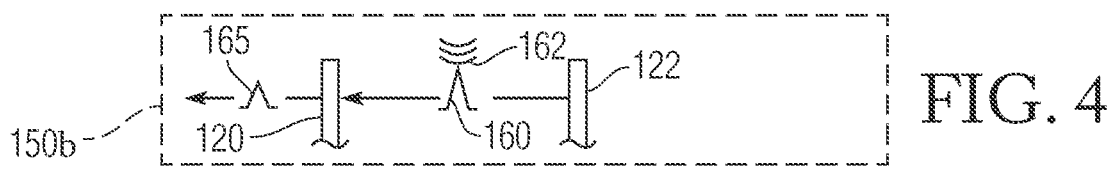
FIG. 4 is a modification of that portion of the arrangement of FIG. 3 within a dashed-line rectangle.

In the embodiment depicted in FIG. 3 the external EMI induces a signal to the right of both of the CITEs 120, 122. FIG. 4 is a schematic illustration of a different scenario in which the hazardous EMI strikes the portion of the power line between the CITEs 120, 122. FIG. 4 illustrates the transmitted portions in dashed box 150*a* as a basis for comparison to box 150 in FIG. 3. As can be discerned, in FIG. 4, unlike FIG. 3, the indicated hazardous EMI is received at a section of the power line between CITEs 120 and 122. A transient electromagnetic signal 160 is induced on power line 104 by the hazardous EMI 162, and a transmitted portion 165 of the signal passes through CITE 120 toward the electrical component (not shown in FIG. 4).

It is typically desirable to keep the length of power line 104 between protected component (P.C.) 100 and the first CITE (i.e., 120) as short as practical. As the probability of impact from external hazardous EMI is proportional to the length of the exposed power line, this limits exposure of the foregoing length of power line 104 to transient electromagnetic signals (induced signals) and the consequent likelihood of this length being impacted by external hazardous EMI. As an example, if the power line extends between first and second transformers, one or more and preferably a plurality of CITEs should be located at both ends of the power line such that a first set of CITEs is located proximate the first transformer and a second set of CITEs is located proximate the second transformer with both sets of CITEs protecting the first and second transformers in the manner described herein. Of course, it will be appreciated that instead of being transformers, the ends of the power line can be connected to any protected electrical component, such as the exemplary ones described herein as well as others.

Figure 5:
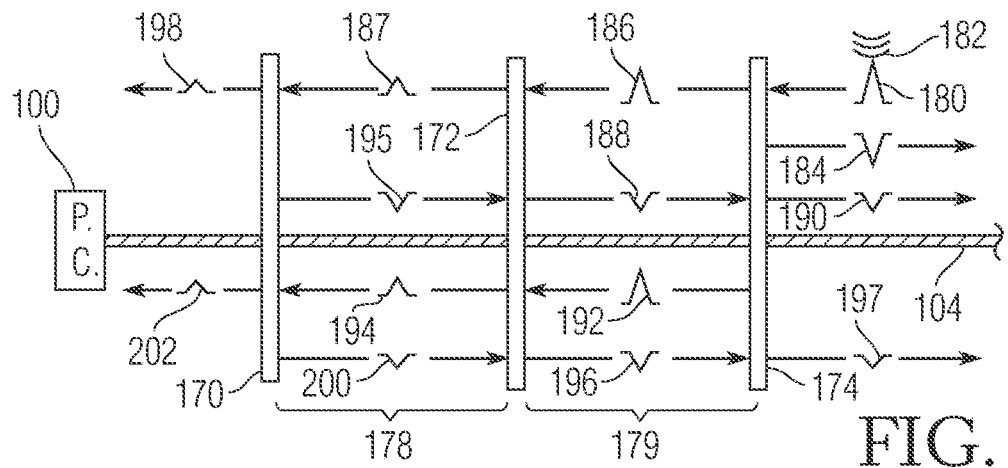
FIG. 5 is a schematic view of another embodiment according to the present disclosure in which a power line is protected by three CITEs (178, 179).

FIG. 5 is a schematic view of another embodiment of the present disclosure in which three CITEs are coupled to a power line 104 to protect electrical components from the transient induced signals originating from a transient electromagnetic disturbance. In this embodiment, CITEs 170, 172, 174 form two decaying resonators, a first resonator 178 between CITEs 170 and 172, and a second resonator 179 between CITEs 172 and 174.

In FIG. 5, the same convention as above applies so that CITEs 170, 172, 174 have first sides that are oriented away from the protected component (P.C.) 100 and second sides that are oriented toward the protected component (P.C.) 100.

In FIG. 5, external hazardous EMI 182 induces or injects signal 180 on power line 104. A portion of signal 180 is reflected the first side from CITE 174 to the right as reflected portion 184. A further portion of transient electromagnetic (induced or injected) signal 180 is transmitted to the left through CITE 174 as transmitted portion 186. In turn, a portion of the transmitted portion 186 reaches the first side of CITE 172 and is reflected back to the right as a reflected portion 188. Another portion of the transmitted portion 186 passes to the left through CITE 172 as the transmitted portion 187. A portion of the transmitted portion 187 is further transmitted through CITE 170 as a transmitted signal 198. It is again noted that in terms of amplitude, transmitted portion 186 has a higher amplitude than transmitted portion 187, which in turn has a higher amplitude than portion 198. Another portion of the transmitted portion 187 is reflected to the right by CITE 170 as reflected portion 195. When the reflected portion 188 reaches the second side of CITE 174, a first portion of the signal is transmitted in signal 190 and a second portion is reflected to the left as signal 192. A first portion of signal 192, directed to the left is transmitted through CITE 172 as signal 194, while a second portion of signal 192 is reflected at the first side of CITE 172 as signal 196. When signal 194 reaches the first side of CITE 170, a first portion of the signal is reflected as signal 200 and a second portion is transmitted through CITE 170 as transmitted portion 202. In addition, when signal 196 reaches the second side of CITE 174, a portion of the signal is transmitted through CITE 174 as transmitted portion 197.

The respective voltages of portions 198 and 202 are the final transmitted portions which are kept sufficiently low to avoid rendering protected component (P.C.) 100 inoperative. Transmitted portions 184, 190 and 197, which are directed to the right from CITE 122, dissipate their energy along power line 104 as heat.

In FIG. 5, the use of two decaying resonators 178 and 179 allows for dissipation of more energy of a transient electromagnetic interference signal, in comparison to the use of a single decaying resonator 125 shown in FIG. 3 because of the larger number of passes of reflected and transmitted signals between the CITEs, which increases heat dissipation along the power line. Accordingly, the use of multiple pairs of decaying resonators can aid in minimizing any portion of a transient induced signal that reaches the protected component 100. It can be appreciated that the CITE structures are not, in and of themselves, intended to act as heat sinks, although they may. Rather, the heat is anticipated to be dissipated by the power line 104 itself by radiative processes.

FIG. 6 is a schematic view of another embodiment in which CITEs according to the present disclosure are used on a power line having a first protected component 201 and a second protected component 203 at the right end of the power line. Thus, in contrast to FIGS. 2-5, FIGS. 6-8 illustrate both ends of the power line, each having respective protected components 201. 203. In the example embodiment of FIG. 6, the first and second protected components are transformers. It is to be understood that they can be other components (as defined above) as well. In FIG. 6, variable CITE element 230 represents a variable number (1 to N) of CITEs and CITE groups associated with protected component 201, and variable CITE element 232 represents a variable number n (from 1 to N) of CITEs associated with protected component 203. The variable CITE element 230 is also shown separately to the right to illustrate the individual elements (1 to N) of the variable CITE. Each element 230, 232 includes a number of adjacent decaying resonators equal to the number of CITEs in the element minus 1 (n−1). For example, if there are three CITEs numbered 1, 2 and 3 positioned on a power line in series, there will be a decaying resonator between CITEs 1 and 2, and another decaying resonator between CITEs 2 and 3. In the example shown in FIG. 6, resonator 235-1 is disposed between CITEs 1 and 2, and resonator 235-2 is disposed between CITEs 2 and 3 of an exemplary variable CITE element.

FIG. 7 is a schematic view of another embodiment similar to FIG. 6 that includes more locations for installing variable CITE elements comprising one or more CITEs. For example, elements 240, 242, 244, 246, 248, 250, 252, 254 are coupled to the power line 104, between protected components 100, 102. Again, each of the variable CITE elements 240-254 can contain 1 to N CITEs. FIG. 7 has a legend that indicates that each of the variable CITE elements 240-252 include a number of adjacent decaying resonators equal to the number of CITEs minus one (n−1). In the example shown in FIG. 7, resonator 235-3 appears between CITEs 1 and 2, and resonator 235-4 appears between CITEs 2 and 3 of an exemplary variable CITE element. The large number of CITEs that can be combined in the arrangement shown in FIG. 7 can provide a large number of decaying resonators to dissipate any signals induced by hazardous EMI. For instance, if variable CITE elements 240 and 242, which are situated proximate to each other on the power line each include 3 CITEs, the total number of CITEs in the general location of elements 240, 242 is 6 CITEs which would provide 5 decaying resonators therebetween.

FIG. 8 is a schematic view of another embodiment in which CITEs are arranged in groups of three along the power line 104. The CITEs within the groups are spaced in relatively close proximity to each other (e.g., between about 1 centimeters and 10,000 centimeters); such spacing is referred to hereinafter as intra-group spacing. CITEs 260, 261 and 262 form a first group; CITEs 265, 266 and 267 form a second group; CITEs 270, 271 and 272 form a third group; and CITEs 275, 276 and 277 form a fourth group. Each of the foregoing groups of three CITEs can be separated from an adjacent group of three CITEs by a larger inter-group distance compared to the intra-group spacing. The intra-group spacing and the inter-group distance are selected, as known to those of ordinary skill in the art, to avoid creating constructive interference as determined by the speed of the induced signal on the power line, which is some portion of the speed of light, as determined by the actual voltage compared to the voltage levels necessary to achieve relativistic speeds, as is known to a person skilled in the art. It is noted that the speed of light in a vacuum is approximately one foot per nanosecond. On an electrical power transmission line (e.g., line 104) of the type contemplated herein, the speed of an electromagnetic wave is slower, on the order of about one foot per 1.25 to 7 nanoseconds, depending on a number of physical considerations. Selecting the spacing between each CITE of a decaying resonator based on the reduced speed of an electromagnetic wave on an electrical transmission line gives rise to an optimal distance between each CITE of a decaying resonator. In some embodiments, the inter-resonator spacing is about 800 to about 1200 feet; however, it will be appreciated that this range is merely exemplary in nature and not limiting. The propagation of pulses in this type of transmission line is well known and is discussed in textbooks on electromagnetic pulse theory.

FIG. 8 also shows adjacent decaying resonators that are intra group (i.e., 235-5 and 235-6 in the first group, 235-8 and 235-9 in the second group, 235-11 and 235-12 in the third group, and 235-14 and 235-15 in the fourth group), and between the groups (i.e., 235-7, 235-10, 235-13).

A pair of CITEs of a decaying resonator can be nested within another pair of CITEs of another decaying resonator. For instance, in FIG. 8, CITE 262 of the first group and CITE 265 of the second group define resonator 235-7 therebetween, while CITE 261 of the first group and CITE 266 of the second group can be considered to define a large resonator 235-15 that contains resonator 235-7. The nesting of CITE's in the foregoing manner increases the degree of attenuation of transient induced signals. This gives a convenient method of designing the system. One takes the maximum amplitude of an induced signal that the system is designed to protect against and divides it by the attenuation factor per nested pair of CITEs of decaying resonators to get the number of nested sets required.

Comparison to Traditional Low Pass Filters

In addition, the CITEs of the present disclosure have useful properties in comparison to conventional low pass filters. The CITEs of the present disclosure can be electrically described as a low Q factor low pass filter. The Q factor, which is the ratio of reactance to resistance, describes how underdamped an oscillator or resonator is, and characterizes a resonator's bandwidth relative to its center frequency. Higher Q indicates a lower rate of energy loss relative to the stored energy of the resonator; the oscillations die out more slowly. Normally, filters are designed to have as high a Q factor as possible, but the present invention is specifically optimized for a low Q factor because that it is the optimal configuration for having the energy trapped by the filter to be dissipated by the filter. Additionally, the CITEs of the present invention distinguish over traditional low pass filters in that the CITEs have a non-resonant design, operate achromatically and have a distinctive and unique frequency response curve. It can be appreciated that a CITE is designed to reflect some portion of the unwanted energy where a conventional filter is designed to absorb it internally as heat.

Conventional low pass filters typically use inductors, capacitors and resistors to form various types of resonant circuits. By using various combinations of these types of components, it is possible to build filters of almost any transfer function. The problem with this approach is that, in common power transmission and distribution power systems that operate 50 to 60 Hertz, and at the conventional AC voltages and currents, the individual components become very large, unwieldy, and expensive. The present invention resolves this by avoiding the use of inductors, capacitors, or resistors and instead substitutes significantly mismatched conductive impedance transition elements (CITEs). The CITEs of the present disclosure are distinguished over traditional low pass filter designs due to their use of selective impedance mismatch to create reflections of unwanted portions of the signal, as opposed to the use of tuned resonant electronic circuits comprised of inductors, capacitors and/or resistors in any combination which simply absorb unwanted portions of the signal.

The CITEs of the present invention provide a more achromatic frequency response in that frequencies under about one megahertz are passed unopposed while higher frequencies are selectively attenuated. The higher the frequency, the higher the attenuation factor, without the need for changing any component values as would be the case with conventional filter designs. Using multiple decaying resonators provides even higher attenuation of the higher frequency components. The design methodology described herein provides a nearly step function frequency response.

It is noted that low pass filters, historically, have not been used for lightning suppression due to the large size and cost of the components involved.

A system with low "Q", quality factor (Q<½) is said to be overdamped. Such a system does not sustain oscillations well, but, when displaced from its equilibrium steady-state output, it returns to it by exponential decay, approaching the steady state value asymptotically. It has an impulse response that is the sum of two decaying exponential functions with different rates of decay. As the quality factor decreases, the slower decay mode becomes stronger relative to the faster mode and dominates the system's response resulting in a slower system. A second-order low-pass filter with a very low quality factor has a nearly first-order step response; the system's output responds to a step input by slowly rising toward an asymptote.

As applied to the present invention in relation to an E1 pulse, a filter with a low Q factor is desirable because it is allows the unwanted energy from a trapped EMP or other transient electromagnetic disturbance to die out in a decaying resonator(s) and be dissipated as heat. As a result of the extremely short pulse width, typically less than 500 nanoseconds for E1 pulses, it is desirable to make use multiple decaying resonators to further decrease the Q factor of the device.

CITE Embodiments

As discussed herein, one of the components of the present system is the impedance transition element (CITE) which is typically arranged in a set of preferably at least two CITEs.

Accordingly, the conductive impedance transition element (CITE) that forms one side of a decaying resonator can be implemented as a conductive disk that is larger in diameter than the power line it surrounds, wherein the conductive disk is electrically coupled to the power line. As mentioned above, the resulting difference in diameters between the CITE and an adjoining portion of power line creates a structure that exhibits a high VSWR for high frequencies of a transient electromagnetic (induced) signal as a result of the ratio of mismatched impedances between the CITEs and the adjacent portion of the power line.

Figure 9:
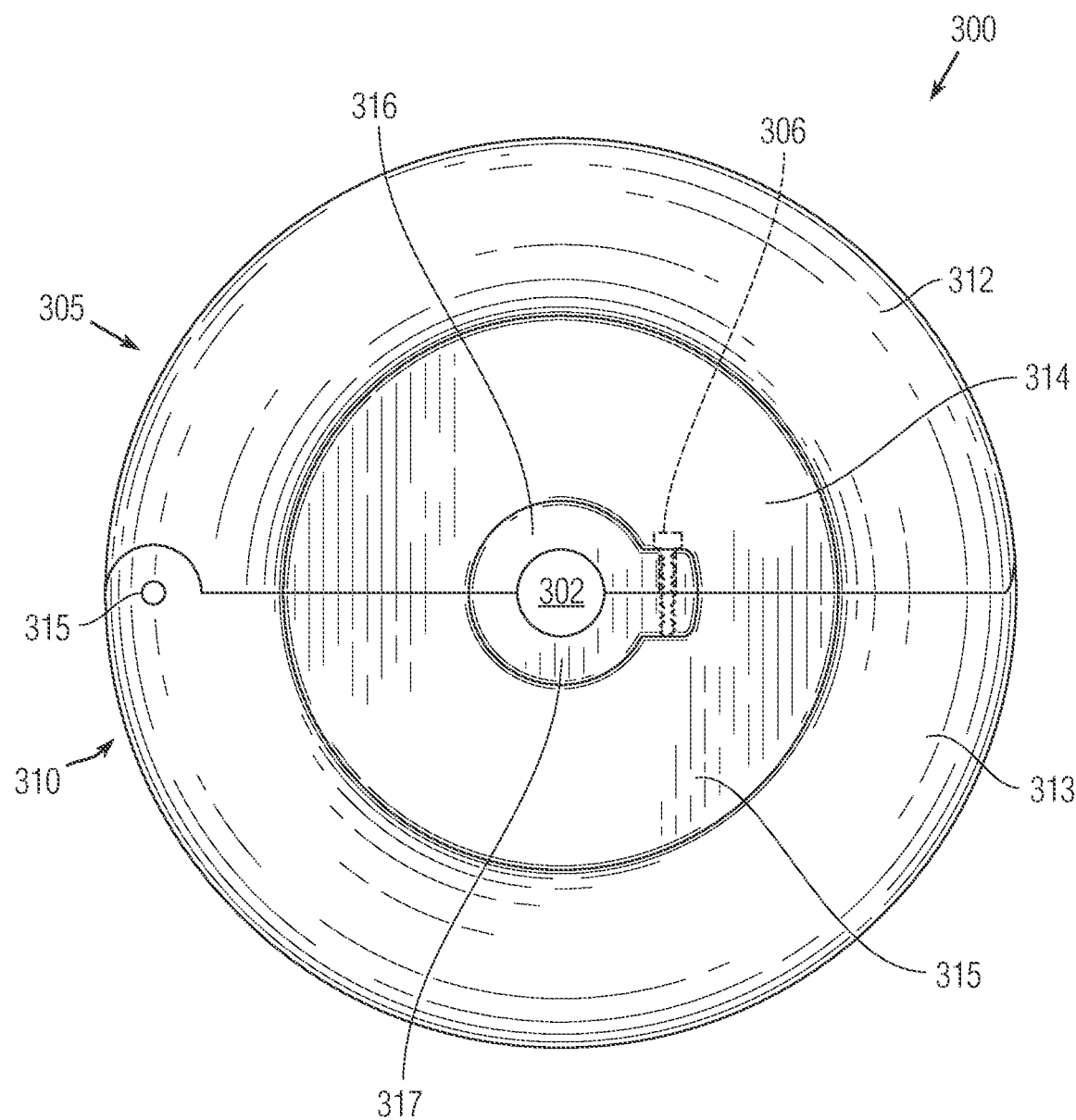
FIG. 9 is a plan view of one side of a first embodiment of a conductive impedance transition element (CITE) according to the present disclosure.

One exemplary embodiment of an CITE according to the present disclosure, and parts thereof, are described in connection with FIGS. 9-15. FIG. 9 is a plan view of one side of a CITE 300. The CITE 300 is formed overall in the shape of a disk, having an opening in the form of a central hole 302. The CITE 300 is formed of a first (e.g., upper) part 305 and a second (e.g., lower) part 310 that are coupled by a hinge element 315 so as to permit the first part 305 and the second part 310 to move between an open position in which the two parts 305, 310 are at least partially separated from one another, and a closed position that is shown in FIG. 9.

As shown in FIG. 9, the CITE 300 has an outer peripheral portion that can have a toroidal shape, as shown, and an intermediate portion, and a center portion in which the center hole 302 is formed. Since the CITE 300 is defined by the first and second parts 305, 310, each of these parts has an outer peripheral portion, the intermediate portion, and the center portion. The outer peripheral portion thus includes rounded edges that are intended to eliminate and/or control coronal discharge.

In the depicted embodiment, the upper component has an outer peripheral section 312 of increased width and the lower component has a corresponding outer peripheral section 313 of increased width. In one implementation, the outer peripheral section 312 is approximately ½ of a torus and the outer peripheral section 313 is likewise approximately half of a torus so that when combined, the two sections 312, 313 define a generally toroidal shape along the outer periphery of the CITE 300. In other words, these sections 312, 313 have rounded surfaces. It is noted that the inner surfaces of 312 and 313 may be textured or even spiked (not shown in FIGS. 9-11 but shown in FIGS. 12-15) to pierce and increase electrical contact with the power conductor that is contained by these elements.

The first part 305 has a middle section 314 recessed with respect to the outer peripheral section 312 and the second part 310 has a corresponding middle section 315 that is recessed with respect to the outer peripheral section 313. Compared to the toroidal shape of the outer peripheral section, the middle sections 312, 314 can be planar in form and generally have a semicircular shape.

The first part 305 also includes a protruding fastening hub 316 positioned on the second side of the CITE which faces toward the protected component (extending out of the page in the view of FIG. 9) and the second part 310 includes a corresponding protruding fastening hub 317 also positioned on the second side of the CITE. As shown, the fastening hubs 316, 317 form a lip around the central hole 302. The fastening hubs are used to securely couple the CITEs to the power line and also to securely fasten the upper and lower parts 305, 310 together as will be described further below with reference to FIGS. 10 and 12. In the view shown in FIG. 9, the upper component 305 is seated upon the lower component.

Figure 10:
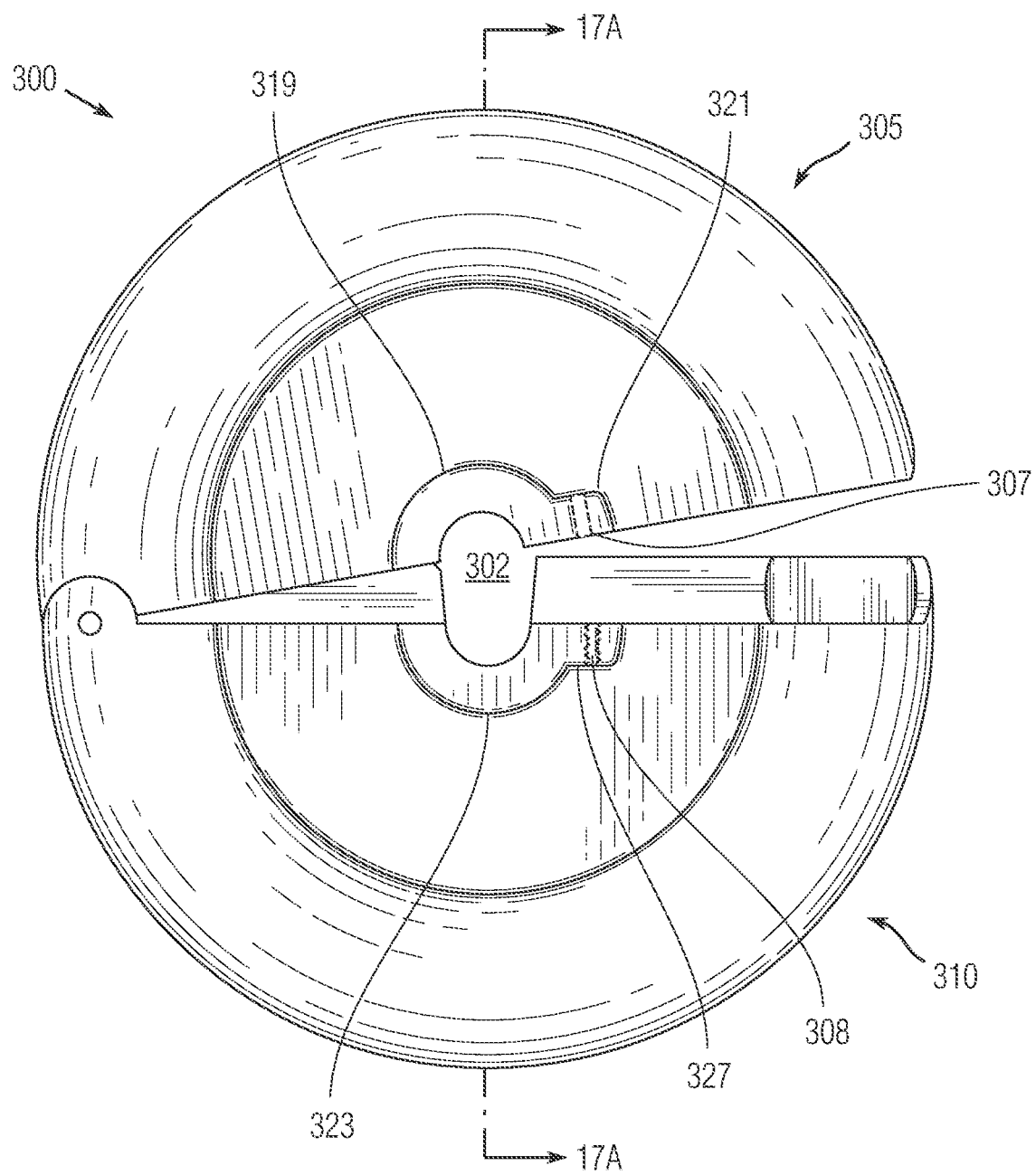
FIG. 10 is a plan view showing an upper component of the CITE pivoted with respect to a lower component about a hinge element, showing the first embodiment in a partially open state to allow mounting onto an electrical power conductor.
Figure 12:
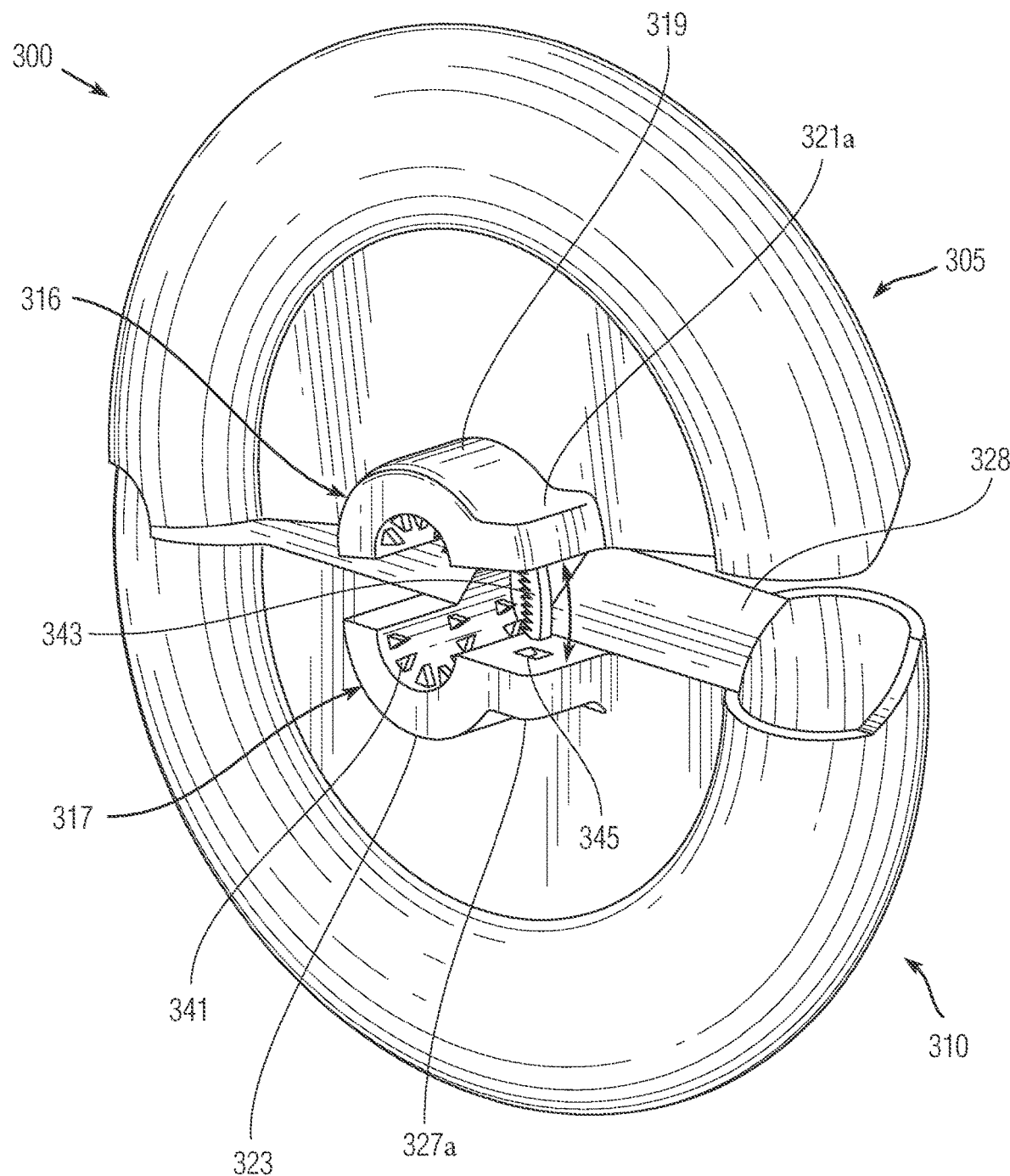
FIG. 12 is a perspective view of the first embodiment of the CITE partially open.

Via the hinge element 315, the upper component 305 can pivot in a counterclockwise direction away from the lower component 310 as shown in FIG. 10. When pivoted, a gap or space is opened up between the upper component 305 and the lower component 310. As shown, the opening of this gap also provides access to the center opening that is defined between the fastening hubs 316, 317 that receives the power line (cable) about which the CITE is disposed. Also depicted in FIG. 10 are clearance hole 307 and threaded hole 308 through respective feet sections 321, 327 of fastening hubs 316 and 317. Returning again to the view of FIG. 9, when the upper and lower sections are brought together (unpivoted) the bore holes 307, 308 match and form a continuous hole through which a fastening element such as a screw or bolt can be inserted, locking the upper and lower sections of the CITE together. An exemplary screw head 303 is shown in FIG. 9 to represent such a fastening element. In some embodiments, the sections 321, 327 can include additional bore holes for receiving additional screws or bolts to further ensure a tight connection between the fastening hubs of the upper and lower parts of the CITE. A rivet can also be used, in which case threaded elements are not needed. Also shown in FIG. 12 is the inclined contact surface 328 of the lower component which seats with a complementary contact surface of the upper component 305 (not shown).

In some embodiments, the fastening hubs 316, 317 are positioned on one side of the CITE 300 (i.e., protrude outwardly perpendicular to the plane of the disc in one direction) and when multiple CITEs 300 are combined in series, the fastening hubs can act as spacers since two adjacent CITEs 300 can be arranged such that the protruding fastening hubs 316, 317 contact, or are in close proximity to, an opposite face of the adjacent CITE 300. Thus, when the two adjacent CITEs 300 are pushed into contact with one another, the fastening hubs sections 316, 317 can determine the distance between the two adjacent CITEs 300. The length of the fastening hubs 316, 317 can be used to define the distance (gap) between the two adjacent CITEs 300 in embodiments in which groups of CITEs are grouped together in a unit. The transmitted transient induced signal that moves from a first CITE 300 toward the protected electrical component thus encounters a second CITE 300 that is located the prescribed set distance (defined as the length of the protruding inner sections 316, 317) away from the first CITE 300. In this way, a series of CITEs 300 can be arranged with controlled spacing along the power line. While it is envisioned that the spacing between adjacent CITEs 300 in the series can be uniform, it will also be appreciated that the spacing can be non-uniform in that there can be at least a first distance between two adjacent CITEs 300 and a different second distance between two other adjacent CITEs 300. Non-uniform spacing of CITEs 300 can be useful in providing multiple destructive interference conditions along the power line 104. As the incoming hazardous EMI can have different spectral components, having non-uniform spacing ensures destructive interference over a range of different frequencies.

In some embodiments, the body of the CITE 300 is made from a lightweight material such as plastic or fiber glass. To make CITEs constructed mainly of such materials, which are insulative in themselves conductive, a conductive coating, for example, of copper, nickel, iron, or mu-metal is applied to the outer peripheral section using techniques known to those of skill in the art including but not limited to electroplating (with or without current) and vacuum deposition. To increase the adhesion of the conductive coating to the outer peripheral section of the CITE, during formation the material out of which the body of the CITE is made can be infused with metallic pieces or particles. It is preferable to use particles of the same composition as the coating to be applied (e.g., iron or nickel). Alternatively, in less preferred embodiments (because heavier) the body of the CITE as a whole can be constructed from a conductive material such as copper, nickel, iron, or mu-metal or a combination thereof.

As discussed further below, performance of the CITE can be improved by increasing the magnetic permeability of the middle section of the CITE 314 can be coated with materials of having high permeability. In preferred embodiments, the middle section can be coated or plated with Mu-metal or high purity iron. In other embodiments, the middle can be coated with ferrite materials.

Figure 11:
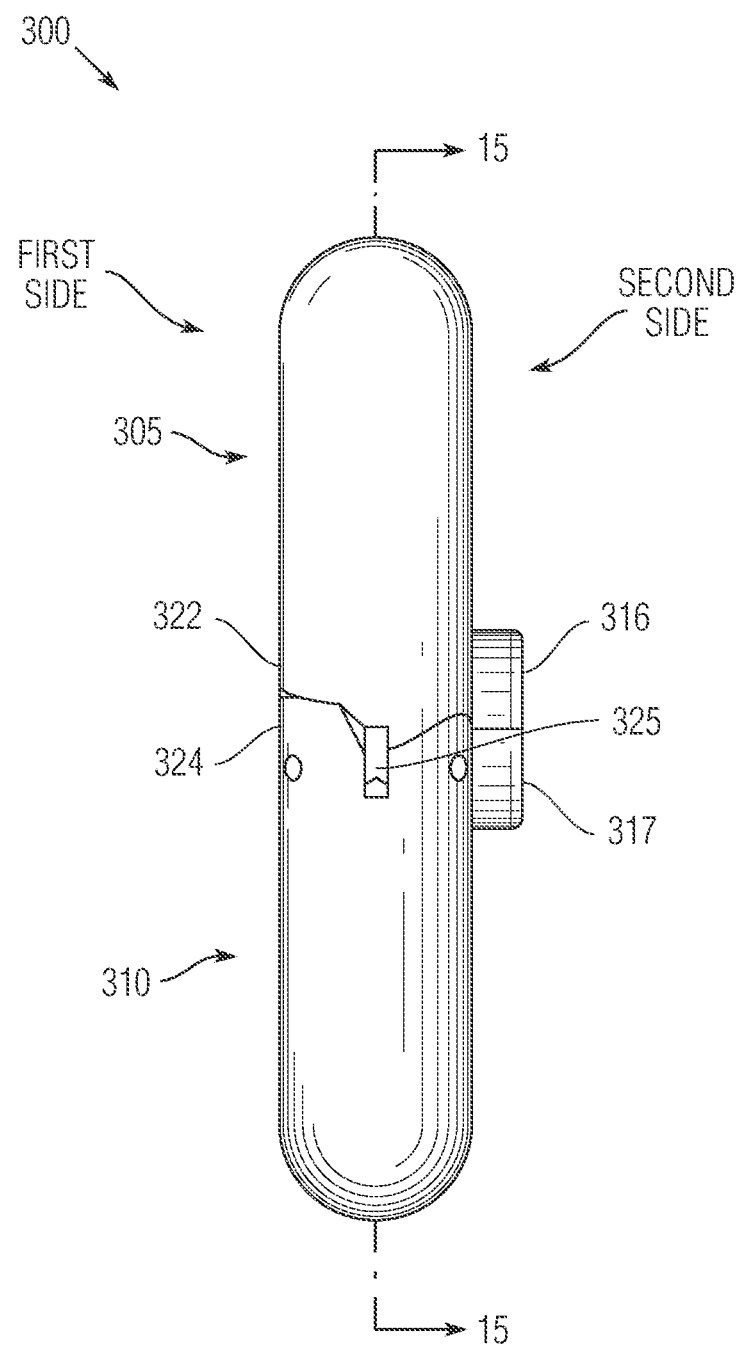
FIG. 11 is a hinge-end view of the first embodiment of the CITE.

FIG. 11 is a hinge end view of the CITE shown in FIG. 10 in which the upper and lower components 305, 310 have been pivoted away from the seated position. In this view it can be seen that the bottom surface 322 of the upper component has a jagged profile and the top surface 324 of the lower component has a complimentary jagged profile adapted to cooperatively engage to the lower surface of the upper component. However, the surfaces 322, 324 do not engage in a flush manner, leaving a notch 325 that extends inwardly into the CITE FIG. 12 is a perspective view of the CITE 300 in a slightly pivoted position, which more clearly illustrates fastening hubs 316, 317. Fastening hub 316 includes a semicircular lip section 319 and a foot rectangular "foot" section 321. Similarly, fastening hub 317 includes a semicircular lip section 323 and a rectangular foot section 327. The "feet" sections 321a, 327a of the respective fastening hubs have a different fastening mechanism from that shown in FIGS. 9 and 10. In this embodiment, the bottom surface of foot section 321a (of fastening hub 316) includes a ratchet element 343 with flexible teeth having the ability to bend and snap in place with respect to matching teeth positioned in a receptacle 345 in the foot section 327b of fastening hub 317. The manufacturing methods and material properties used for such ratcheting fasteners are known to those of skill in the art. When the CITE is being closed and ratchet element 343 enters the receptacle 345 the upper and lower sections 305, 310 are secured together in place. Also shown in FIG. 12 is the inclined contact surface 328 of the lower component which seats with a complementary contact surface of the upper component 305 (not shown).

The inner surfaces of the semicircular sections 319, 323 of the fastening hubs include sharp incision elements 341 (identified collectively). The incision elements are adapted to cut into the outer surface of the power line when the CITE is mounted and the fastening hubs 316, 317 close around the power line. By cutting into the power line, a firm, secure, and conductive connection between CITE and the power line is ensured. The incision elements 341 can be formed in pyramidal form as shown, as spikes, or in other shapes that would support the functional purpose of the incision elements as known to those of ordinary skill in the art. The number and sizes of the individual incision elements used can vary based on the known characteristics of the power line.

To prevent arcing, a conductive paste is applied to all joints in the CITE and to the interface between the CITE and the power line. For example, during installation on a power line, a conductive paste such as ConductoLube, manufactured by Cool Amp ConductoLube Co. of Lake Oswego, Oreg., or the equivalent, can be applied on surfaces 328 and to all other interfaces between the upper and lower components 305, 310. In the embodiment shown, the conductive paste is also applied to the hinge surfaces 322, 324 to prevent arcing at the hinge element as well. Once the CITE has been mounted around the power line, and the power line is position in the central hole 302 of the CITE, conductive paste can be applied around the edge of the central hole to ensure a uniform conductive connection between the CITE and the power line.

Figure 13:
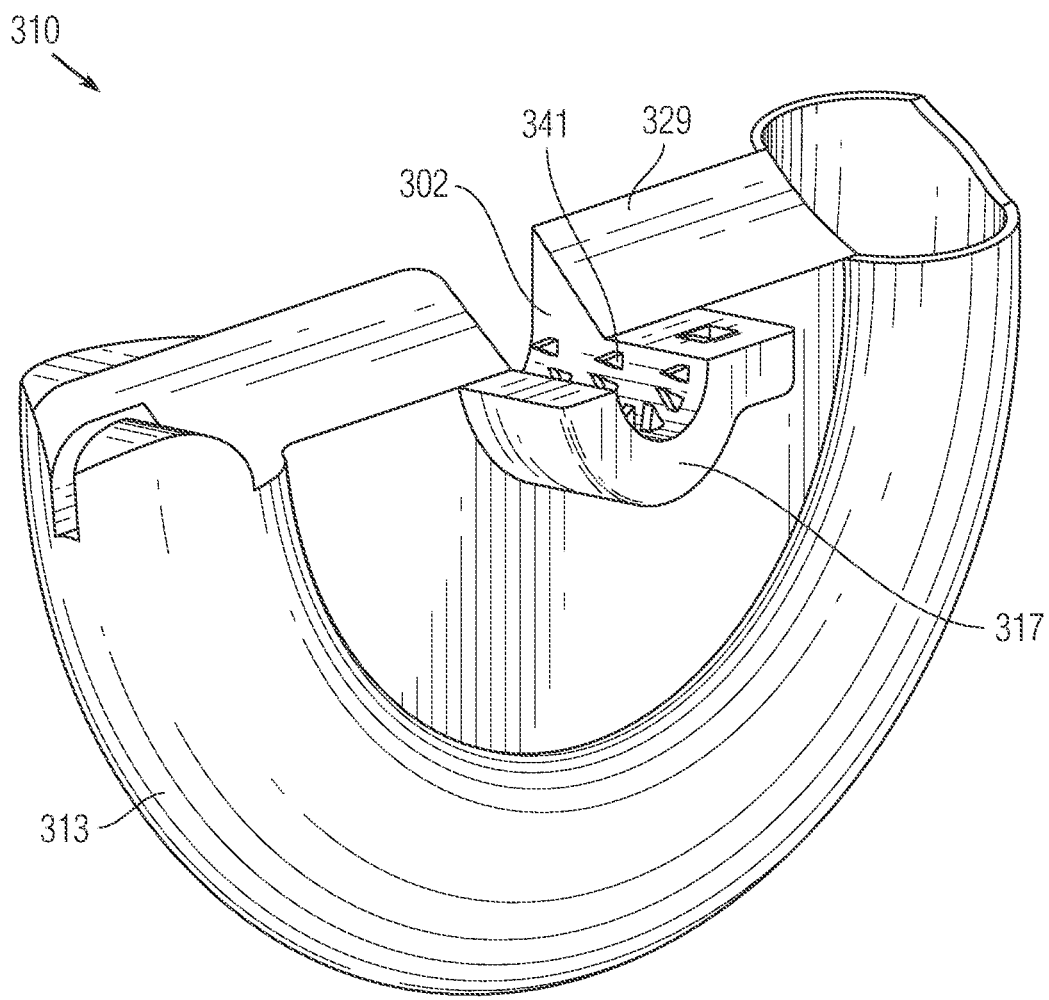
FIG. 13 is a perspective view of the lower component of the first embodiment of the CITE.
Figure 14:
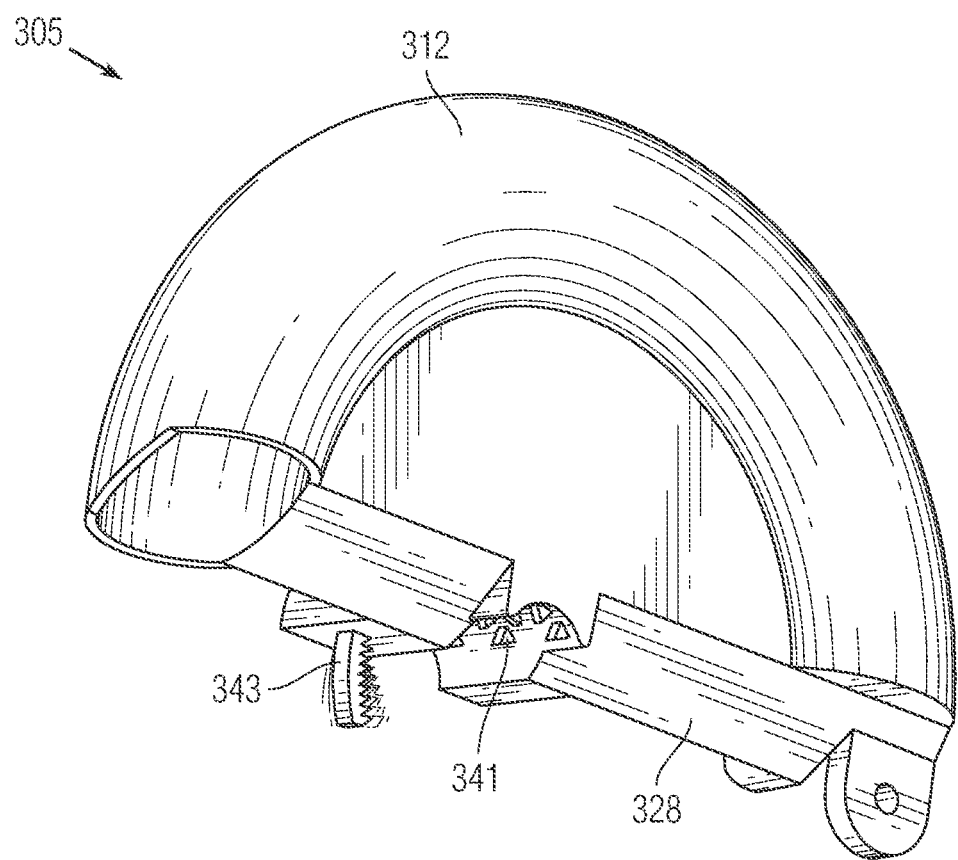
FIG. 14 is a perspective view of the upper component of the first embodiment of the CITE.
Figure 15:
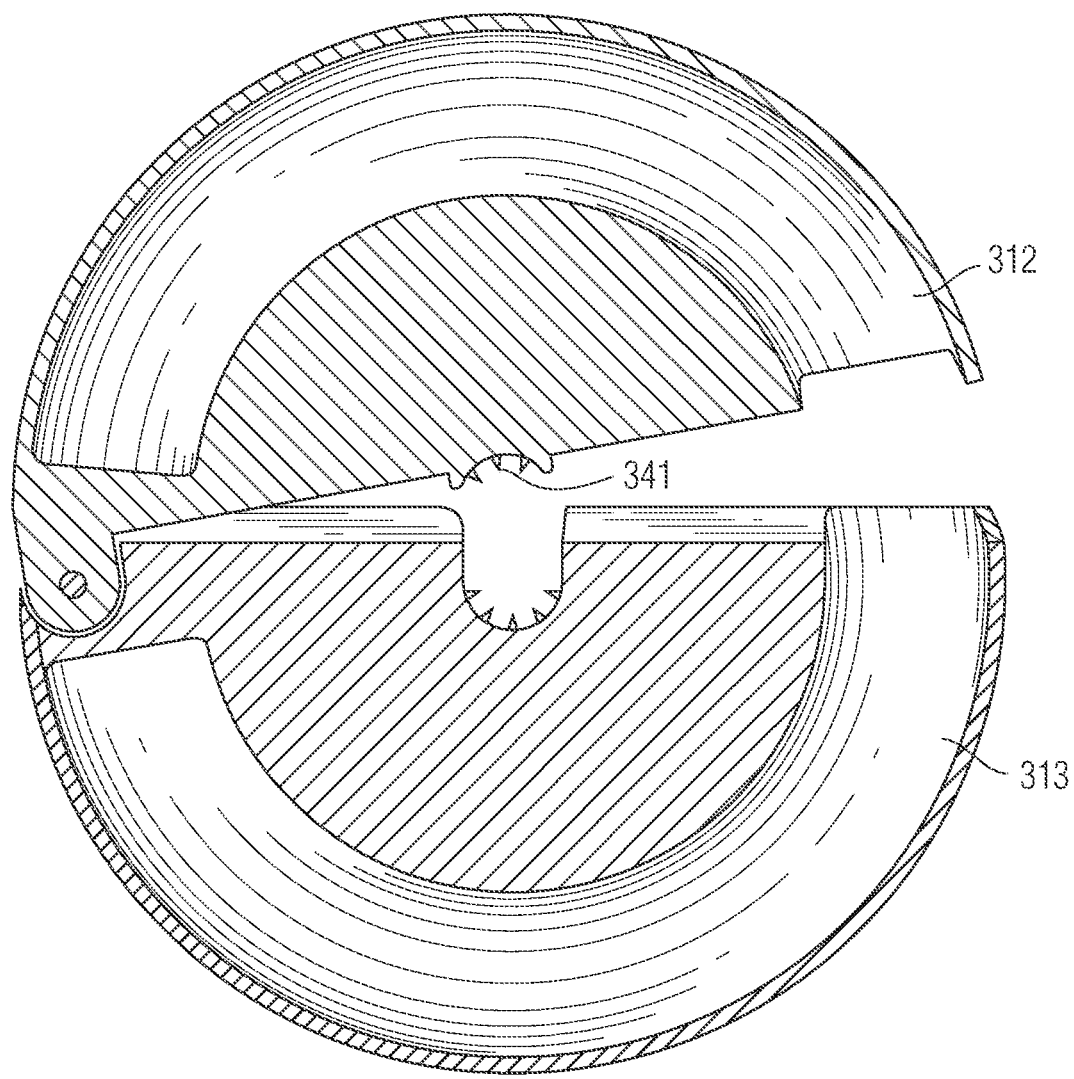
FIG. 15 is a longitudinal cross-sectional view of the first embodiment of the CITE taken through axis 15-15 in FIG. 11.

FIG. 13 is a perspective view of the lower component 310 of the CITE and FIG. 14 is a perspective view of the upper component 310. The component views of FIGS. 13 and 14 more clearly illustrate the inclined contact surfaces 328, 329 on which the upper and lower components connect. Both surfaces 328, 329 are discontinuous and broken in the middle to provide for the central hole 302. FIG. 15 is a longitudinal cross-sectional view taken through axis 15-15 in FIG. 11. The view of FIG. 15 illustrates that most of the outer sections 312, 313, other than the hinge element 315 of the respective upper and lower components are hollow, which helps reduce the weight and cost of the CITE.

The construction of the CITE 300 thus allows for the easy opening of its structure to allow receipt of a cable and then the sealed closing of the upper and lower components 305, 310 results in the capturing of the cable, thereby causing the CITE 300 to be securely coupled to the cable.

In another embodiment of a CITE 1300, shown in FIGS. 28A and 28B, the upper component of the CITE, similar to the upper component of the embodiments shown in FIGS. 9-16 has a tongue element 355 that protrudes from a bottom surface of the component. The lower component includes a complementary groove 357 sized to tightly receive the tongue element with a small amount of tolerance, in order to achieve a solid electrical contact. The tongue-groove pair, together with the fastening hub, aids in securing the upper and lower components together after the CITE is mounted on a power line.

Figure 16:
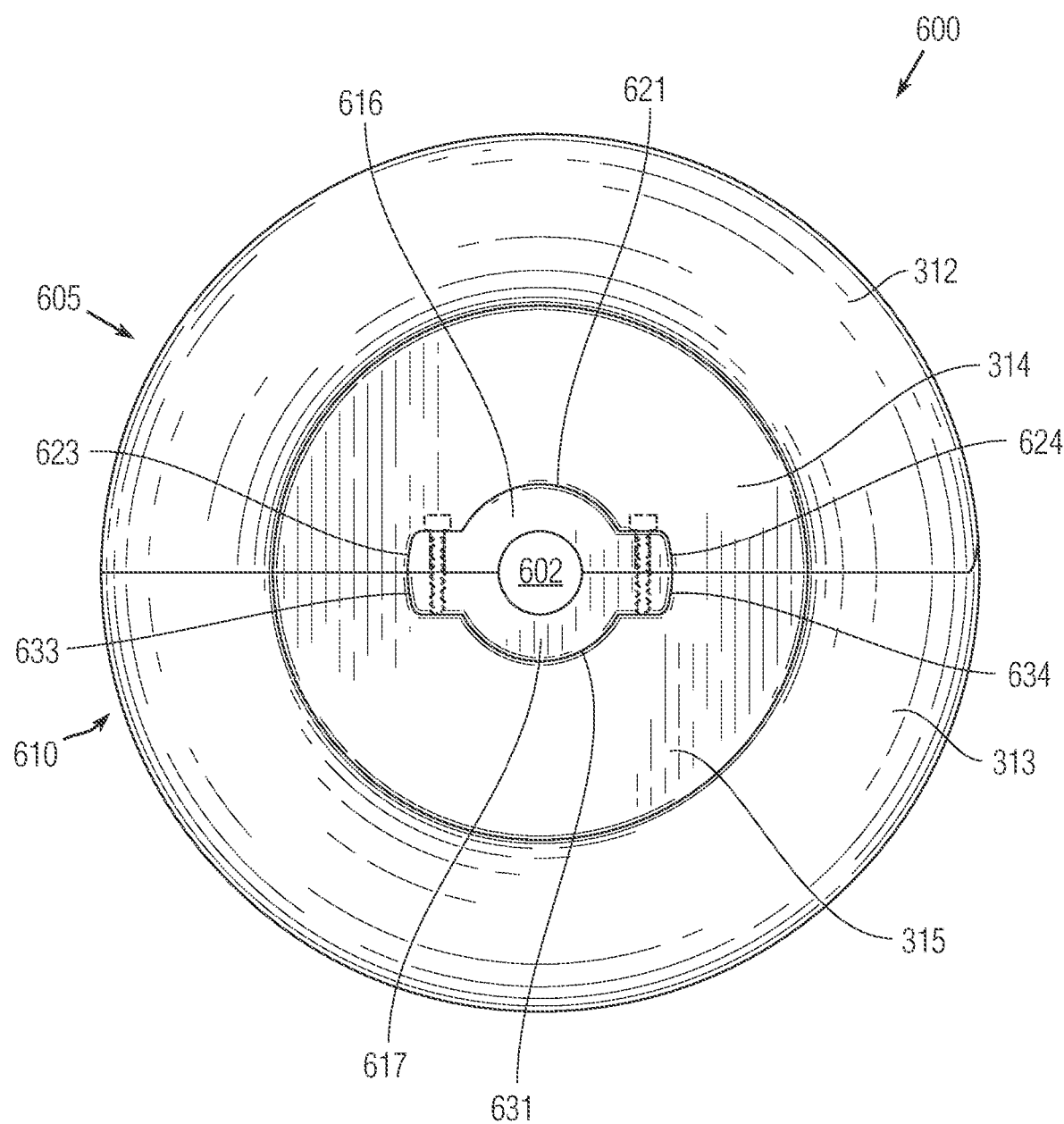
FIG. 16 is a plan view of one side of another embodiment of a CITE according to the present disclosure.

FIG. 16 is a perspective view of another embodiment of a CITE according to the present disclosure. The CITE 600 includes upper and lower sections 605, 610 that are not attached at a hinge element. In the embodiment shown, fastening hub 616 of section 605 comprises a semicircular lip 621 which forms an edge around a central hole through the cite 602, and two feet sections 623, 624 positioned on either side of the semicircular lip 621. Similarly, fastening hub 617 of section 610 comprises a semicircular lip 631 positioned around central hole 602 and two feet sections 633, 634. Foot section 623 of the upper section couples to foot section 633 of the lower section, and foot section 624 of the upper section couples to foot section 634 of the lower section to secure the upper and lower sections to each other. In a preferred embodiment, matching threaded bore holes are drilled through sections 623/633 and 624/634 allowing screws, bolts, rivets or similar fastening elements to extend through and securely join the matching sections. Upon installation on a power line, conductive paste is applied to the entire interface between the upper and lower sections to prevent arcing any possible gaps between the sections.

While in the embodiments shown in FIGS. 9-16 the cross-sectional shape of the CITE is circular, one or more of the CITEs employed can have other shapes including elliptical, polygonal, and non-uninform (e.g., asymmetrical and/or irregular). In all such embodiments, the cross-sectional dimensions of the CITEs are larger than the diameter of the power line upon which they are mounted, and deliberate impedance mismatch occurs as in the case of circular CITEs.

Use of CITE Elements for Signaling Purposes

The CITEs of the embodiments shown in FIGS. 9-16 can be usefully adapted to signal the presence of a high voltage line, for example in airports and other facilities in which it is useful to call out the presence of high voltage power lines for distant visibility. In one implementation of a CITE 1000, shown in FIG. 24, walls of the outer peripheral "torus" section 1010 can be made, at least in part, of a transparent material such as a plastic or fiber glass. As the torus sections are hollow, they can be filled with a gas, such as neon, which fluoresces in the presence of a high electric field. Fluorescence radiation e.g., 1015 emanating from the outer peripheral section 1010 is shown. When a CITE including a transparent (or partially transparent) torus filled with such as gas is mounted onto a high voltage power line, the electric field produced by the power line causes the gas to fluoresce. This fluorescence makes the CITE visible from afar, and thereby signals the presence of the high voltage power line to which the CITE is mounted.

It is noted that the normal components of a gas discharge light need to be present. Therefore, a getter pump is desirable to maintain the purity of the fluorescing gas which is preferably a noble gas such as neon or argon.

Additional CITE Embodiments

Figure 17:
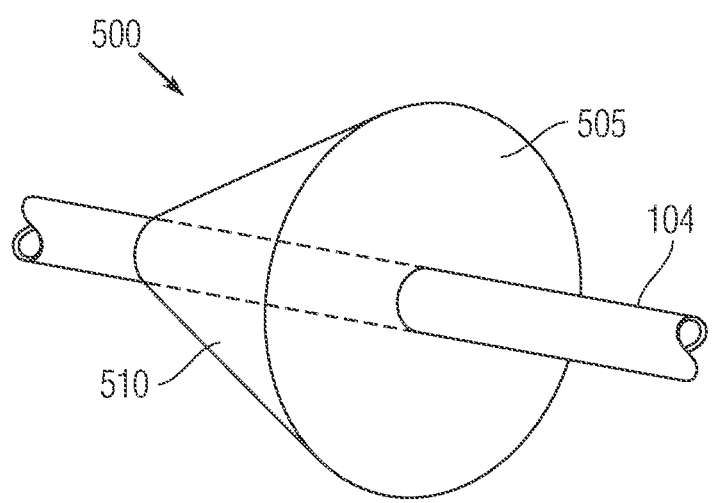
FIG. 17 is a perspective view of another embodiment of a conductive impedance transition element (CITE) according to the present disclosure.
Figure 19A:
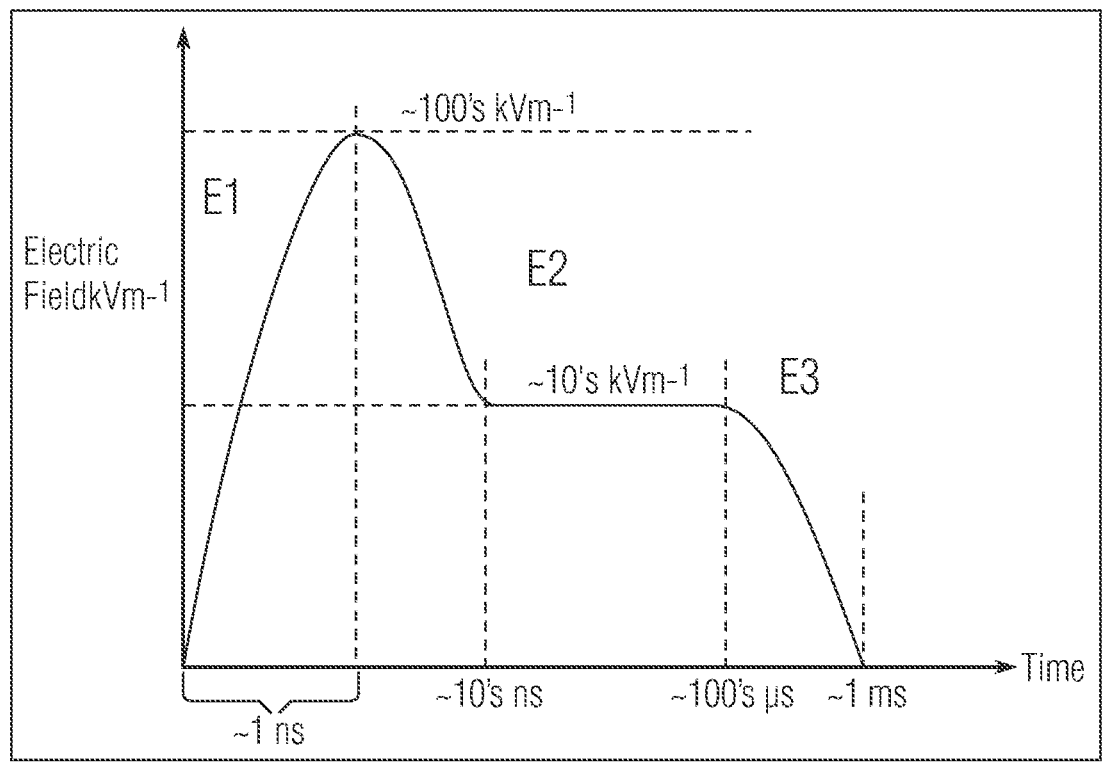
FIG. 19A is a graph of an EMI waveform generated by an exemplary endo-atmospheric detonation (SREMP) over time. (From Sandia National Laboratory, hereinafter "Sandia").
Figure 19B:
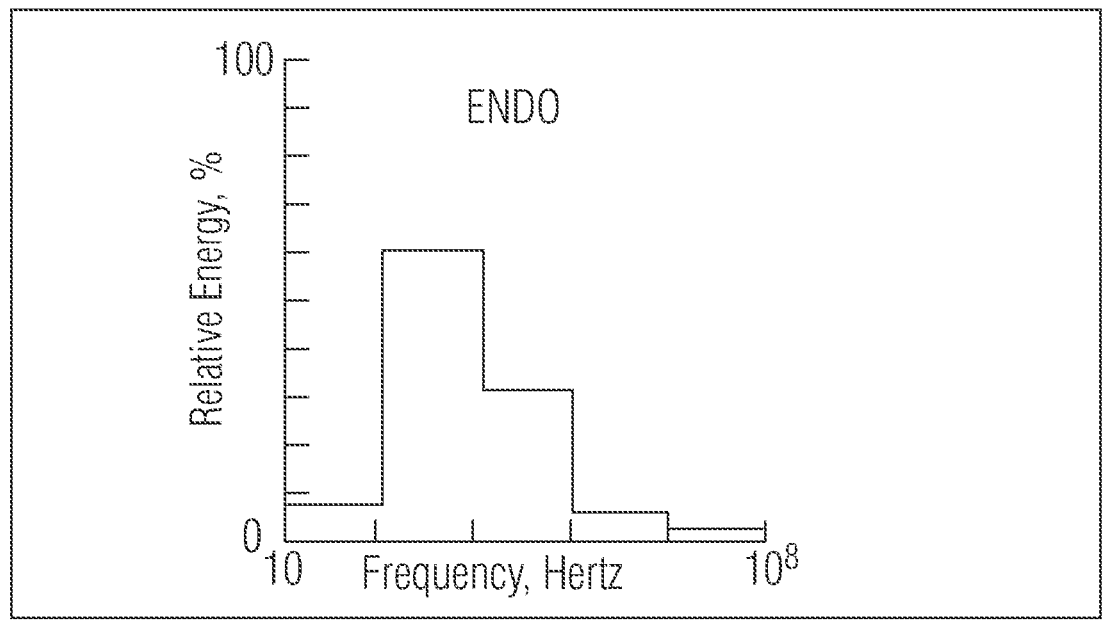
FIG. 19B is a graph of the relative energy of the SREMP waveform versus frequency. (From Sandia).

FIG. 17 shows an alternative embodiment of an impedance transition element (CITE), numbered 500. As with all CITEs described herein, CITE 500 is conductive and makes conductive contact with power line 104, which it encircles (surrounds). CITE 500 has a generally flat face 505 shown on the right, and a conically surface 510 which inclines away from surface 510 toward the left. The flat face 505, as the first reflecting surface, presents an abrupt impedance change compared to the impedance of the adjacent portion of power line 104 (to the right of face 505) due to the abrupt change in diameter. The conically shaped face on the left presents a more gradual change in impedance compared to the impedance of the adjacent portion of power line 104 (to the left of flat face 510). Accordingly, the flat face 505 is used for reflecting a transient electromagnetic interference signal. As with the previous embodiment, the CITE 500 functions as a result of it having a much greater diameter (dimensions) compared to the dimensions (diameter) of the power line.

FIGS. 18A-18C illustrate CITE embodiments having different cross-sectional shapes. FIG. 18A shows an embodiment of a CITE 701 having upper and lower sections 705, 710 that when assembled have an elliptical cross-sectional shape. FIG. 18B shows an embodiment of a CITE 711 having upper and lower sections 715, 720 that when assembled have a polygonal (in this case hexagonal) shape and FIG. 18C shows an embodiment of a CITE 712 having upper and lower sections 725, 730 that when assembled have an asymmetrical cross-sectional shape. In the embodiments shown, CITEs 701, 711 and 721 are otherwise similar structurally to the embodiment shown in FIG. 16 (e.g., they each include a similar fastening hub with threaded elements on both lateral sides of a central hole for mounting to a power line).

As noted above, it is practical to form CITEs from lightweight elements such as fiberglass or plastic and to coat the CITEs with materials having conductivity and a high magnetic permeability. In a preferred embodiment, the outer "torus" portion of the CITE can be coated with a conductive metal such as copper, nickel, high purity iron of mu-metal using electroplating or vacuum deposition. The middle section of the CITE can be plated with Mu-metal which has extremely high magnetic permeability. As the middle portion has a smaller surface area than the outer torus portion, this reduces the volume of Mu-metal or high purity iron which is applied, reducing overall costs while still providing greatly enhanced magnetic permeability. In some embodiments, Mu-metal or iron is coated on only one side of the CITE, while in other embodiments, both sides are coated. With the addition of Mu-metal or iron, a much smaller CITE structure (i.e., lower diameter) can be used to obtain the same degree of attenuation of the E1 pulse.

Furthermore, the performance of magnetic shields can be improved by constructing the shields with alternating layers of high and low permeability material. The degree of improvement is dependent on a number of factors including the specific permeabilities of the materials used, their thickness, their spacing, etc. In additional embodiments, a CITE can be constructed by adding layers of Mu-Metal or high purity iron symmetrically arranged on both sides of the CITE to produce a "sandwich" structure with a cross-section of high-low-high (HLH) permeability. FIG. 32 shows an embodiment of a side having such a "sandwich" structure. As shown a CITE 1400 has a first Mu-metal or high purity iron layer 1410 coated on the surface of a first side of the CITE and a second Mu-Metal or high purity iron layer 1420 coated on the surface of a second side of the CITE. It is also possible to add additional layers, but for practical purposes, a 3-layer CITE is a preferred design.

In other implementations, it is practical to form CITEs either totally or partially from ferrite components. The use of ferrite offers a number of benefits, including reduction of physical size and decreased Q factor, but at increased cost. FIG. 21 shows another embodiment of a conductive impedance transition element (CITE) in the form of a ferrite bead located coaxially on power line 104. The geometry and electromagnetic properties of ferrite bead CITE 570 results in a relatively high impedance for high-frequency signals that attenuate the relatively high frequencies of signals induced by external hazardous EMI on a power line and also of high frequency radio interference (RFI) electronic noise. The energy from these sources is either reflected back along power line 104 toward the source of the induced signal or is dissipated as low-level heat along the power line. Only in extreme cases is the heat noticeable. It is noted that ferrites also absorb energy as well as reflecting some portion of it.

A CITE generally does not dissipate energy but, instead, produces reactance that impedes the flow of the relatively high frequencies of a transient electromagnetic interference signal. This reactance is commonly referred to simply as impedance, although impedance can be any combination of resistance and reactance. Ferrite concentrates the magnetic field and increases impedance and therefore reactance, which impedes or 'filters out' high frequency signals. Ferrite beads are regularly made in split configurations which facilitates installation on an existing power line.

If the ferrite component is so designed, it can produce an additional loss in the form of resistance heating in the ferrite itself. The Q factor of an inductor is the ratio between the its reactance and resistance at a given frequency. When the Q factor of a ferrite inductor is low, it has relatively high resistance and is therefore subject to resistive heating. Depending on the application, the resistive loss characteristic of the ferrite may or may not be desired. A design of a ferrite CITE that uses a ferrite bead to improve noise filtering (in addition to protecting electrical components from a transient electromagnetic interference signal) should take into account specific characteristics of a circuit including the ferrite CITE and also the frequency range to block. Different ferrite materials have different properties with respect to frequency. A person of ordinary skill in the art will find that manufacturer's literature may be helpful in selecting the most effective material for the frequency range. It is noted that ferrite structures consisting of two or more different ferrite compositions may be utilized to optimize both the reflective and absorptive properties of the CITE. There are a variety of methods of combining two or more ferrite components that would be known to those of skill in the art.

As is known to those of skill in the art, the permeability of ferrite depends upon the specific ferrite blend used. In general, ferrites have permeability ranging from 1500 to 3000 (relative). If a material with substantially higher permeability is used, such as Mu-Metal (75-80% nickel, balance dependent on specific alloy) which has a permeability in the range of 80,000-100,000 on the same relative scale, then the size of the CITE can be reduced while having at least the same magnetic permeability properties. Thus, as noted above, with the addition of Mu-metal, a much smaller CITE structure can be used to obtain the same degree of attenuation of the E1 pulse. In some embodiments, a CITE of reduced size can include a layer of Mu-metal coated onto the surface of one side of the CITE.

In embodiments employing Mu-metal or high purity iron, it is necessary to make a conductive bond between the MU-Metal or high purity iron and the aluminum. This can be achieved by a number of means including, but not limited to, conductive epoxy bonding, soldering, brazing, pressure (frictional) bonding, etc.

It is further desirable to have the Mu-Metal or high purity iron from one side of the CITE extend across the centerline to overlap and electrically connect with the Mu-Metal or high purity iron on the other side of the device. This ensures that the magnetic properties are those of a contiguous ring rather than a ring with a gap in it. If a gapped design is used, the gap should be sufficiently wide as to prevent arcing. The dimensions of said gap will be driven by the operating voltage that the CITE is designed to operate at.

It is noted that for optimal operation, following fabrication of the Mu-Metal or high purity iron, it needs to be hydrogen fired and annealed as is know to persons of ordinary skill in the art.

Regardless of the shape of conductive impedance transition elements (CITEs), it is important to note that multiple pairs of CITEs may be used to increase the attenuation of the reflected transient electromagnetic interference signal. Such multiple pairs of impedance transition elements constitute the preferred embodiment of the current invention. It is further noted that impedance transition elements are designed and formed so as to be consistent with good high voltage engineering practice to prevent or minimize the formation of arcs, coronal discharge, and electrical shorts. These shapes are well known to persons of ordinary skill in the high voltage arts.

Conductive impedance transition elements (CITEs) are simple physical structures which can be manufactured by a variety of methods. These methods include, but are not limited to, machining, casting, die casting, injection molding, forging, stamping, lost wax casting, powder metallurgy and sintering, 3D additive manufacturing, profiling with a water jet, profiling with a laser, etc., and combinations of these methods. Additionally, the CITEs can be assembled from component parts, such as disks with anti-corona rings attached to the exterior perimeter, and a clamp mechanism attached to the center. The specific method(s) chosen will be routine to persons of ordinary skill in the art and would usually be based upon on most cost-effective method(s) for making the number of devices required over a given period of time, as well as the manufacturing processes available to the manufacturer.

In a number of the implementations, the CITE is assembled from upper and lower components, which are each manufactured separately. In other embodiments, CITEs can be fabricated in other ways, including from longitudinal sections. FIGS. 22A and 22B are plan views illustrating a method of assembling a CITE from two longitudinal sections. FIG. 22A shows a front view of a disc-shaped first section 805. The front surface of the section shown defines a "plane of the section." The first section has a slot 808 that extends from the outer circumference of the disc to the center. The diameter of slot 808 is set to allow a power line 804 to be received into the slot as shown. A removable bracket 815 is shown placed beneath in inner end of the slot 808 at the center of section 805. The bracket includes clearance holes for receiving threaded elements 817, 818 such as screws or bolts. The back of section 805 cab include additional fastening elements (e.g., holes) for receiving fasteners such as screws or bolts that extend transversely, perpendicular to the plane of the section (not shown in FIG. 22A).

FIG. 22B is a rear view of a complementary disc-shaped second section 820. The second section 820 is designed to be fitted to section 805 to assemble the CITE. Second section 820 includes slot 822 shaped similarly to slot 808 of section 805 to receive the power line 804. A bracket 825, complementary to the bracket 815 of the top section is shown above the inner end of slot 822. Bracket 825 includes threaded holes 827, 828 adapted to receive the threaded elements 817, 818 of the complementary bracket 815 of the first section. In this manner, the first section can be secured to the second section with the brackets 815, 825 forming a tight fit around the power line 804. In addition, the surface of the second section can include threaded holes e.g., 831, 832 for receiving additional fastening elements. In this manner the sections can be fastened together via the complementary brackets 815, 825 that fasten the first and second sections in the plane of the sections, and additionally via additional fastening elements that fasten the first and second sections along an orientation transverse to the plane of the section.

In another embodiment, shown in FIG. 23, the CITE 900 is formed in the shape of a sphere 905 having a diameter greater than the diameter of the power line 904. This is not the preferred form for a CITE, but the sphere also provides an impedance mismatch which causes reflection of incoming hazardous EMI.

Further, the CITEs of the present invention are comprised of simple structures that clamp on to existing power lines. They have no active electronic circuitry, nor do they contain any internal components that can be damaged or degraded during virtually any operational scenario.

Additionally, as a function of their physically simple design, impedance transitional elements can be readily mass produced. Accordingly, their cost for a pair of CITEs that form a decaying resonator can be a small fraction of the cost of other solutions. Further, because CITEs can be designed to be easily installed on live power lines, installation time and costs can be substantially reduced compared to other technologies. The savings can be particularly significant because the supply of power over the power line is not interrupted.

Absorber Elements

The CITE elements described above are conductive and do not absorb the energy of incoming hazardous EMI. In the embodiments shown in FIG. 2-8, the energy of the incoming EMI is dissipated as heat along the power line. To enhance the rate of dissipation and to reduce the amount of energy that the power line is required dissipates per unit time, one or more absorber elements can be mounted to the power line in association with or in addition to the CITE elements. The absorber elements can be formed in a similar manner to the CITEs but are made from resistive or semi-resistive (or semi-conductive) materials, such as graphene. The resistive materials are designed to absorb energy from incoming hazardous EMI and to convert the electromagnetic energy into heat. The heat thus generated dissipates over time into the environment by radiative or conductive cooling. One or more absorber elements can be added at regular or irregular intervals along the power line. In one example, in which groups of CITEs are assembled together, an absorber element can be added to each assembly or positioned adjacent to each assembly. This is only one example, and those of skill in the art can readily appreciate that absorber elements can be added in various numbers and configurations consistent with their purpose of providing additional heat dissipation capacity.

The absorber elements can be separate, standalone element, or, in some embodiments, the absorber elements can be integrated as part of the CITE elements. A mix of separate and integrated absorber elements can also be used. FIGS. 25A-C show disc elements in which the central portion of the disc is made from different materials. In FIG. 25A, the central portion 1025 is made from resistive or semi-conductive material such as graphene which acts as an absorber element. In FIG. 25B, the central portion 1035 is made from a metal such as an aluminum. This embodiment is similar to the CITEs described above with reference to FIGS. 9-16. FIG. 25C shows a disc element in which the central portion 1045 is made from ferritic material which can act both as a reflector and absorber of incoming hazardous EMI.

Another embodiment of an integrated CITE/absorber element is shown in FIGS. 26A and 26B. In this embodiment, one side of the CITE 1105 includes a conductive central portion 1115 and the opposite side of the CITE 1110 includes an absorptive material (resistive or semi-conductive) in its central portion 1120 element. It is noted that the CITE assembly may be composed of various combinations of conductive, absorptive, and ferritic materials in an array of CITEs (such as is shown in FIG. 8) to achieve maximum suppression of the unwanted high frequency components of the incident signal.

Embodiment for Adjacent Power Cables of the Same Phase

Many high voltage power line installations have multiple, parallel sets of phase lines. In such installations, the multiple phases of each set of power lines are arranged at a distance to each other typically measured in feet, while the parallel power lines of the same phase are arranged much closer to each other, typically measured in terms of inches. In other words, the inter-phase conductor spacing is an order of magnitude larger than the spacing of conductors of the same phase. This is due to the fact that because the adjacent power lines of the same phase are at the same voltage, they can be spaced fairly closely together. The actual spacing depends on characteristics of the power lines, such as their diameter and other factors. In some embodiments, the distance between the sets of adjacent power lines of the same phase can be, for example, 2 inches to 36 inches, and more typically 6 inches to 12 inches apart. Generally, all of the parallel power lines have the same diameter.

FIG. 29A shows an example of a CITE that is specifically adapted to provide protection against hazardous EMI to dual adjacent, parallel power lines of the same phase. Those of skill in the art would appreciate that the embodiment depicted could be extended to installations having more than two distinct adjacent, parallel sets of power lines (an example of which is shown is depicted in FIG. 31 and discussed below). In the embodiment shown in FIG. 29A, the power lines are depicted as being horizontally adjacent to each other. This is one possible arrangement; however, the adjacent power lines can be set any angle or orientation with respect to each other as long as they remain parallel and do not come too close to power lines of other phases. Returning to FIG. 29A, the CITE 1150 includes an upper section 1155 and lower section 1160. The upper section 1155 includes an upper central hub 1157, and the lower section 1160 includes a lower central hub 1162. In the embodiment depicted, the upper central hub section 1157 includes two arcuate, hemi-cylindrical notches and the lower central hub section 1162 includes complementary arcuate, hemi-cylindrical notches. As can be discerned, when the upper and lower sections 1155, 1160 are assembled, the notches of the upper and lower central hubs join and form two central holes 1171, 1172 in which the adjacent, parallel power lines can be received. Incision elements, e.g., 1174, 1175 are positioned on inner surfaces of holes 1171, 1172.

FIG. 29B shows an enlarged view of the upper and lower central hubs 157, 162 and the central holes 1171, 1172. In FIG. 29B the closest distance (D) between the central holes 1171, 1172 is shown. As noted above, the distance (D) is determined by the installation of the power lines, and can be in the range of 2 inches to 36 inches. Accordingly, the hub region of the CITE 1150 for multiple, adjacent power lines is typically larger than in the CITE embodiments for single power lines. The diameter of the CITE can also be correspondingly larger to accommodate the larger hub. As with other embodiments, the CITE 1150 can be made using metals such as aluminum or copper; the CITE can include ferrites materials, and, in some implementations can also include absorber elements as described above.

FIG. 30 is a perspective view of the CITE 1150 for dual phase lines. The view of FIG. 30 shows the CITE in a slightly open position in which the CITE can be installed on parallel power lines, with the parallel power lines inserted through central holes 1171, 1172. This view also clearly depicts a ratchet locking mechanism for securing the upper and lower sections of the CITE 1155, 1160 to each other. In the embodiment depicted, the locking mechanism comprises a ratchet element 1180 with teeth and a corresponding receptacle 1182 with a corresponding profile adapted to securely receive the ratchet element. It is noted that aspects of the designs adapted for single power lines described above and shown in FIGS. 9-28E can be further adapted to mounting on multiple adjacent, parallel power lines of the same phase. For example, a CITE adapted for multiple lines can include a hinge and can use a different locking mechanism from the mechanism shown in FIG. 30.

FIG. 31 is a front plan view of another view of an embodiment of a CITE 1200 adapted for three phase lines, shown without the central hubs and incision elements. The CITE 1200 includes an upper section 1205 and a lower section 1210. Both the upper and lower sections are preferably semicircular in shape as depicted with arcuate circumferences and planar beveled edges (as shown in FIG. 12). The upper section 1205 includes two arcuate notches 1207 that emerge from the on the planer edge. In this example embodiment, the lower section 1210 is not an exact mirror image of the upper section. In particular the planar edge of lower section is modified by a central polygonal notch 1212 having a wide side at the planar edge and the narrower side toward the circumference of the lower section. In the embodiment shown, the polygonal notch is trapezoidal in shape, but the polygonal notch can be formed in other shapes, asymmetric or symmetric. The narrow edge of the polygonal notch further contains a central arcuate notch 1214. The polygonal notch 1212 in the lower section is filled in with a correspondingly shaped polygonal insert 1220, having a wide edge positioned on the planar edge of the lower section, and a narrow edge positioned on the narrow edge of the polygonal notch of the lower section. The wide section of the polygonal insert 1220 has two further arcuate notches that match in position and mate with respective actuate notches 1207 and 1209 of the upper section. An arcuate notch 1226 on the narrow edge of the polygonal insert matches in position and mates with arcuate notch 1214 of the lower section. The polygonal insert 1220 and machine surfaces on the edges of the upper section and lower section can be machined with tongue and groove features or other mating elements so that the polygonal insert is secured in place upon being positioned in the polygonal notch 1212, precluding any motion of the insert along the axis of the power line conductors. It is also noted that the polygonal insert and related notches can be in the upper section instead of the lower section.

As can be discerned, the matching arcuate notches 1207/1222, 1209/1224 and 1226/1214 form holes in which power lines of the same phase can be seated. During installation of the CITE 1200, a power line can be seated on notch 1214 of the lower section. The polygonal insert 1220 can then be placed over this power line. Additional power lines can be placed on notches 1222, 1224 of the insert, and the upper section can be placed over the additional power lines. The sections can be secure using fasteners described in the embodiments discussed above. In addition, the arcuate notches can include incision elements as described above. Conductive paste should be used to seal the edges joining the polygonal insert 1220 to the lower section 1210 of the CITE. In certain embodiments (not shown in FIG. 31), the upper and lower sections of the CITE can be hinged (as shown, for example, in FIG. 10)

Impedance Mismatching for Underground Power Cables

The embodiments above pertain to exposed, above-ground power lines. A significant number of power lines, particularly in metropolitan regions, are not exposed, but rather run underground. It would be useful to provide impedance mismatch elements in underground cables to provide protection for electrical and electronic components attached thereto. FIGS. 27A and 27B are, respectively, an axial cross-sectional view and a longitudinal cross-sectional view of a coaxial power cable 1200 having periodic variation in impedance according to the present disclosure. The cable includes a core 1205 having one or more conductive wires, a semiconductive layer 1210 surrounding the core, a conductive shield layer 1215, and an insulating layer 1220 surrounding the shield layer. As shown in FIG. 27B, the semiconductive layer 110 has periodic variation in content which corresponds to periodic variations (differentials) in impedance. For example, areas 1232 and 1234 have higher resistance compared with respective adjacent regions 1233 and 1235.

The adjacent regions of differential impedance create impedance mismatch interfaces at which received hazardous EMI is reflected in a manner similar to the way induced signals along the above-ground powerline are reflected by the CITE elements.

It is noted that there are several methods of achieving the variations in the impedance of the semiconductive layer. These include, but are not limited to, varying the conductivity of the composition of the semiconductive layer, varying the thickness of the semiconductor layer, and others as would be obvious to a person of ordinary skill in the manufacture of coaxial type cables.

As would be clear to those of ordinary skill in the art, the CITEs described herein can be used in conjunction with other protective means that utilities use to protect against hazardous EMI, such as but not limited, to vacuum tube devices.

The scope of the claims should not be limited by the preferred embodiments and examples described herein, but should be given the broadest interpretation consistent with the written description as a whole. It will be apparent to a person of ordinary skill in the art that there are many possible variations that fall within the scope of this specification.

What is claimed is:

1. A device for preventing an electrical signal induced by hazardous EMI on one or more power lines in a group of multiple adjacent, parallel power lines of the same phase in an electrical power generation, transmission, and distribution system from reaching an electrical component connected to one of the multiple parallel power lines, the device comprising:
at least one conductive impedance transition element, the at least one conductive impedance element comprising a disk-shaped structure having multiple holes being dimensioned and spaced apart from one another so as to receive and surround one of the multiple adjacent power lines of the same phase, the disk-shaped structure having an outer diameter that is greater than diameter of all of the multiple parallel power lines to deliberately create an impedance mismatch between the conductive impedance transition element and adjacent portions of the multiple power lines;
wherein the impedance mismatch causes the at least one conductive impedance transition element to reflect high-frequency components of a signal induced on the multiple power lines by hazardous EMI, and
wherein the high-frequency components are reflected and dissipated as heat.

2. The device of claim 1, wherein the at least one conductive transition element includes two central holes to receive dual adjacent, parallel power lines.

3. The device of claim 1, wherein a magnitude of the impedance mismatch is dependent upon a frequency and permits low frequency spectral components of the induced transient electromagnetic signal to pass by the at least one conductive impedance transition element while reflecting the unwanted high-frequency spectral components of the induced transient electromagnetic signal from the at least one conductive impedance transition element.

4. The device of claim 1, wherein one or more of the at least one conductive impedance transition element is composed entirely, or in part, of ferrite material.

5. The device of claim 4, wherein one or more of the at least one conductive impedance transition element is composed of two or more different ferrite materials.

6. The device of claim 1, wherein a ratio of the outer diameter of the at least one conductive impedance transition element to the diameter of the multiple power lines is in a range of about 1.5:1 to 100:1.

7. The device of claim 6, wherein the ratio of the diameter of the at least one conductive impedance transition element to the diameter of the multiple power lines is preferably in a range of about 2:1 to 80:1.

8. The device of claim 1, wherein each of the at least one conductive impedance transition element comprises a first section and a second section, each of the first part and the second sections including a plurality of fastening hubs, each fastening hub having a notch for receiving the power line, wherein the fastening hubs of the first and second sections are fastened together to secure the first and second part together when mounted on the power line.

9. The device of claim 8, wherein the fastening hubs of the at least one conductive impedance transition element have inner surfaces bearing incision elements adapted for cutting into the multiple power lines and thereby securing the conductive impedance transition element to the power line.

10. The device of claim 8, wherein the plurality of fastening hubs of the first part and second sections each include a plurality of hemi-cylindrical portions and a foot portion, the foot portion of the first section having a ratchet element and the foot portion of the second section having a receptacle having features matching the ratcheting element, enabling the first and second sections to be fastened to each other.

11. A device for preventing an electrical signal induced by hazardous EMI on one or more power lines in a group of multiple adjacent, parallel power lines of the same phase in an electrical power generation, transmission, and distribution system from reaching an electrical component connected to one of the multiple parallel power lines, the device comprising:
at least one conductive impedance transition element, the at least one conductive impedance transition element comprising a disk-shaped structure comprising an upper section and a lower section, at least one of the upper and lower section containing a notch for receiving an insert including further notches for receiving the multiple adjacent power lines of the same phase, the disk-shaped structure having an outer diameter that is greater than diameter of all of the multiple parallel power lines to deliberately create an impedance mismatch between the at least one conductive impedance transition element and adjacent portions of the multiple power lines;
wherein the impedance mismatch causes the at least one conductive impedance transition element to reflect high-frequency components of a signal induced on the multiple power lines by hazardous EMI, and
wherein the high-frequency components are reflected and dissipated as heat.

12. The device of claim 11, wherein the insert is polygonal in shape, and the notches of the insert match corresponding notches of one of the upper and lower section of the at least one conductive impedance transition element.

13. The device of claim 1, wherein the disk-shaped structure of conductive impedance transition element has a radially outer portion having a first thickness and a radially middle portion have a second thickness smaller than the first thickness, and the structure is composed of one of a plastic and a fiber glass material.

14. The device of claim 13, wherein the outer portion of the conductive impedance transition element is coated with a conductive material.

15. The device of claim 13, wherein the conductive material includes at least one of copper and nickel.

16. The device of claim 13, wherein the middle portion of the conductive impedance transition element is coated with a material of high magnetic permeability.

17. The device of claim 16, wherein the material of high magnetic permeability is Mu-metal.

18. The device of claim 16, wherein the material of high magnetic permeability is high purity iron.

* * * * *